United States Patent
Lee

(10) Patent No.: US 11,737,223 B2
(45) Date of Patent: Aug. 22, 2023

(54) FOLDABLE ELECTRONIC DEVICE INCLUDING A SLIDING-TYPE HINGE STRUCTURE BENEATH A FLEXIBLE DISPLAY

(71) Applicant: Samsung Electronics Co., Ltd., Gyeonggi-do (KR)

(72) Inventor: Sangchul Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 212 days.

(21) Appl. No.: 16/847,080

(22) Filed: Apr. 13, 2020

(65) Prior Publication Data
US 2020/0329574 A1 Oct. 15, 2020

(30) Foreign Application Priority Data

Apr. 12, 2019 (KR) .................. 10-2019-0042984
Oct. 31, 2019 (KR) .................. 10-2019-0137847

(51) Int. Cl.
*H05K 5/02* (2006.01)
*E05D 1/04* (2006.01)
(Continued)

(52) U.S. Cl.
CPC ............. *H05K 5/0226* (2013.01); *E05D 1/04* (2013.01); *E05D 7/00* (2013.01); *G06F 1/1615* (2013.01);
(Continued)

(58) Field of Classification Search
CPC .. H05K 5/0226; H05K 5/0017; G06F 1/1615; G06F 1/1652; G06F 1/1681
See application file for complete search history.

(56) References Cited

U.S. PATENT DOCUMENTS 9,250,733 B2  2/2016  Lee et al.
9,348,450 B1  5/2016  Kim
(Continued)

FOREIGN PATENT DOCUMENTS

KR  1020120016873  2/2012
KR  10-1133050  4/2012
(Continued)

OTHER PUBLICATIONS

European Search Report dated Jun. 8, 2021 issued in counterpart application No. 20169409.8-1216, 6 pages.
(Continued)

*Primary Examiner* — Rockshana D Chowdhury
*Assistant Examiner* — Douglas R Burtner
(74) *Attorney, Agent, or Firm* — The Farrell Law Firm, P.C.

(57) ABSTRACT

A foldable electronic device is provided. The foldable electronic device includes a housing including a first part and a second part; a flexible display seated on the first part and the second part; and a hinge structure configured to fold and unfold the first part and the second part of the housing. The hinge structure includes a hinge member including a sliding part and a connection part extending from the sliding part and connected to the first part or the second part; a guide member; and a hinge housing covering the hinge member and the guide member. The guide member is fastened to the hinge housing to form a space with the hinge housing, and the sliding part is received in the space and performs a sliding motion between the guide member and the hinge housing.

12 Claims, 35 Drawing Sheets

(51) Int. Cl.
  E05D 7/00     (2006.01)
  H05K 5/00     (2006.01)
  G06F 1/16     (2006.01)
  H04M 1/02     (2006.01)
  E05D 11/08    (2006.01)

(52) U.S. Cl.
  CPC .......... G06F 1/1652 (2013.01); G06F 1/1681 (2013.01); H04M 1/0268 (2013.01); H05K 5/0017 (2013.01); E05D 11/082 (2013.01); *E05Y 2900/606* (2013.01)

(56) References Cited

U.S. PATENT DOCUMENTS

| | | | |
|---|---|---|---|
| 9,784,406 B1* | 10/2017 | Lin | G06F 1/166 |
| 9,927,845 B1 | 3/2018 | Holung et al. | |
| 10,001,815 B1* | 6/2018 | Yao | H05K 5/0234 |
| 11,061,445 B2* | 7/2021 | Kim | G06F 1/1616 |
| 11,314,284 B2* | 4/2022 | Kim | G06F 1/1652 |
| 11,392,179 B2* | 7/2022 | Park | G06F 1/16 |
| 11,493,966 B2* | 11/2022 | Kim | G06F 1/166 |
| 11,537,173 B2* | 12/2022 | Kim | G06F 1/1641 |
| 2011/0063783 A1 | 3/2011 | Shim et al. | |
| 2014/0173851 A1* | 6/2014 | Gong | E05D 1/04 16/355 |
| 2014/0293534 A1* | 10/2014 | Siddiqui | G06F 1/166 248/688 |
| 2015/0192965 A1* | 7/2015 | Chang | G06F 1/1681 361/679.56 |
| 2015/0378397 A1* | 12/2015 | Park | G06F 1/1635 361/679.27 |
| 2016/0070306 A1 | 3/2016 | Shin et al. | |
| 2016/0097227 A1* | 4/2016 | Hsu | G06F 1/1681 16/354 |
| 2018/0230726 A1* | 8/2018 | Chen | E05D 11/10 |
| 2019/0033920 A1* | 1/2019 | Yun | G06F 1/1641 |
| 2019/0086965 A1* | 3/2019 | Kuramochi | G06F 1/1652 |
| 2019/0369668 A1* | 12/2019 | Kim | G06F 1/1681 |
| 2020/0163239 A1* | 5/2020 | Yun | G06F 1/1681 |
| 2020/0264673 A1* | 8/2020 | Kim | G06F 1/1616 |
| 2020/0323091 A1* | 10/2020 | Nagai | H04M 1/0268 |
| 2021/0191475 A1* | 6/2021 | Park | G06F 1/1652 |
| 2021/0250431 A1* | 8/2021 | Park | H04M 1/0268 |
| 2021/0271294 A1* | 9/2021 | Liao | H04B 1/3827 |
| 2021/0318723 A1* | 10/2021 | Cheng | G06F 1/1618 |
| 2021/0355988 A1* | 11/2021 | Cheng | H04M 1/0268 |
| 2021/0373609 A1* | 12/2021 | Kim | G06F 1/166 |
| 2022/0061174 A1* | 2/2022 | Xie | G06F 1/1641 |

FOREIGN PATENT DOCUMENTS

| | | |
|---|---|---|
| KR | 101875855 | 7/2018 |
| TW | M551604 | 11/2017 |
| TW | M569382 | 11/2018 |

OTHER PUBLICATIONS

European Search Report dated Nov. 23, 2020 issued in counterpart application No. 20169409.8-1216, 22 pages.
European Search Report dated Jul. 23, 2020 issued in counterpart application No. 20169409.8-1216, 21 pages.
International Search Report dated Jul. 31, 2020 issued in counterpart application No. PCT/KR2020/004985, 7 pages.
Chinese Office Action dated Apr. 29, 2023 issued in counterpart application No. 202010287072.4, 27 pages.

* cited by examiner

FOLDABLE ELECTRONIC DEVICE INCLUDING A SLIDING-TYPE HINGE STRUCTURE BENEATH A FLEXIBLE DISPLAY

CROSS-REFERENCE TO RELATED APPLICATION(S)

This application is based on and claims priority under 35 U.S.C. § 119 to Korean Patent Application Nos. 10-2019-0042984 and 10-2019-0137847, which were filed in the Korean Intellectual Property Office on Apr. 12, 2019 and Oct. 31, 2019, respectively, the entire disclosure of each of which is incorporated herein by reference.

BACKGROUND

1. Field

The disclosure relates generally to a foldable electronic device.

2. Description of Related Art

In recent years, portable electronic devices, such as smart phones and tablet personal computers (PCs), have become lighter, thinner, and shorter for ease of portability, and have been developed in various ways for ease of use. A foldable-type electronic device provides a relatively larger screen than an ordinary bar-type electronic device, and when folded, the foldable-type electronic device is reduced in size and is convenient to carry.

In a foldable electronic device, two or more plates may be pivotally connected to each other via a hinge to be unfolded or folded, and a display may be disposed on the plates connected to each other via the hinge. Conventionally, a plurality of physically separated displays were arranged one on each of the plates. However, in recent years, with the development of flexible display technology, it has become possible to dispose, on the plates, a single flexible display capable of providing a large screen integrally without being physically broken. For example, in a window used to protect the exterior of a display, by replacing an existing glass substrate with a highly flexible, highly hard, and transparent plastic (e.g., polyimide (PI)) film, it is possible to provide an electronic device with a flexible display to be foldable/unfoldable.

Existing foldable electronic devices often include a rotation mechanism using hinges disposed on opposite sides of a display. However, in such a structure, the hinges disposed on the opposite sides of the display are exposed to the product exterior, and when a protective mechanism or an exterior cover is used to cover the hinges, the size of the product increases.

Recently, a method of disposing a hinge under a portion in which a display is folded has been used in order to prevent the hinge from being exposed to the product exterior. However, even in this newer structure, the thickness of the product may increase due to the region occupied by the hinge.

SUMMARY

The disclosure is made to address at least the disadvantages described above and to provide at least the advantages described below.

An aspect of the disclosure is to provide a foldable electronic device in which a sliding-type hinge structure is disposed under a portion in which a flexible display is folded.

Another aspect of the disclosure is to provide a hinge structure that is disposed below a portion in which the flexible display is folded, in order to minimize exposure of the hinge structure and to maximize a ratio of the screen relative to an entire area, when the foldable electronic device is unfolded.

Another aspect of the disclosure is to provide a sliding structure, in order to minimize the thickness of the hinge structure, thereby minimizing an overall thickness of a foldable electronic device.

In accordance with an aspect of the disclosure, a foldable electronic device is provided, which includes a housing including a first part and a second part; a flexible display seated on the first part and the second part; and a hinge structure configured to fold and unfold the first part and the second part of the housing. The hinge structure includes a hinge member including a sliding part and a connection part extending from the sliding part and connected to the first part or the second part; a guide member; and a hinge housing covering the hinge member and the guide member. The guide member is fastened to the hinge housing to form a space with the hinge housing, and the sliding part is received in the space and performs a sliding motion between the guide member and the hinge housing.

In accordance with another aspect of the disclosure, a foldable electronic device is provided, which includes a housing including a first part and a second part; a flexible display seated on the first part and the second part; and a hinge module configured to fold and unfold the first part and the second part of the housing. The hinge module includes a first hinge member including a first sliding part and a first connection part extending from the first sliding part and connected to the first part; a second hinge member including a second sliding part and a second connection part extending from the second sliding part and connected to the second part; a first guide member; a second guide member; a first gear connected to the first sliding part; a second gear connected to the second sliding part; a third gear connecting the first gear and the second gear to each other; a lower housing; and an upper housing. The first guide member is fastened to the lower housing and forms a first space with the lower housing, the second guide member is fastened to the lower housing and forms a second space with the lower housing, the first sliding part is inserted into the first space and slides in a first direction between the first guide member and the lower housing, and the second sliding part is inserted into the second space and slides in a second direction opposite the first direction between the second guide member and the lower housing.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
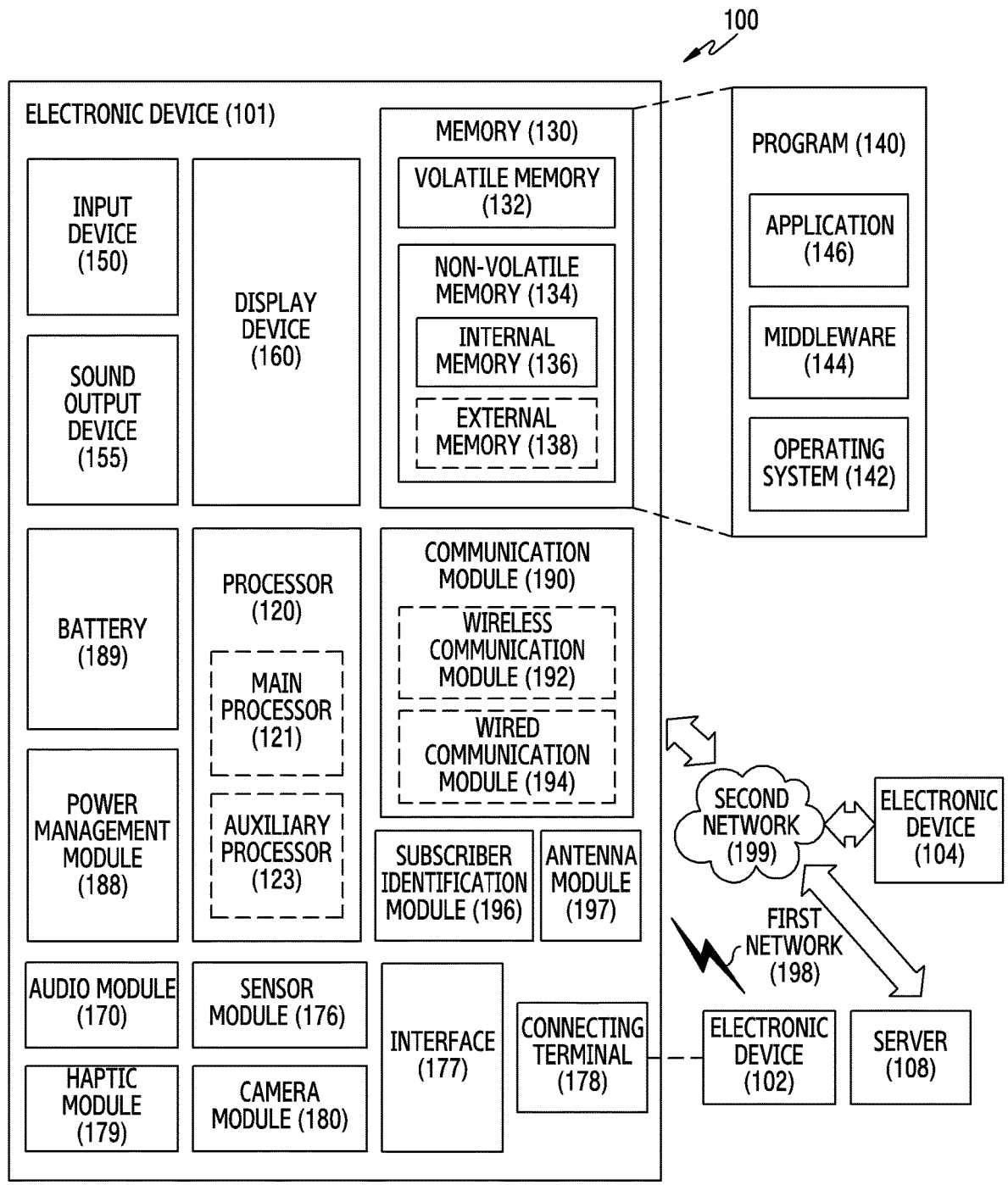
FIG. 1 illustrates an electronic device in a network environment according to an embodiment.

Hereinafter, various embodiments will be described in detail with reference to the accompanying drawings. However, in the drawings, the components may be exaggerated or reduced in size for convenience of description. For example, the size and thickness of each component shown in the drawings are arbitrarily shown for convenience of description, and thus the present disclosure is not necessarily limited to the illustrated. In connection with the description of the drawings, the same or similar components may be denoted by the same or similar reference numerals.

FIG. 1 illustrates an electronic device in a network environment according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, and an antenna module 197. Alternatively, at least one of the components (e.g., the display device 160 or the camera module 180) may be omitted from the electronic device 101, or one or more other components may be added in the electronic device 101. Further, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, the hologram the device, and the projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). The connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. The camera module 180 may include one or more lenses, image sensors, ISPs, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, Wi-Fi direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a printed circuit board (PCB)). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
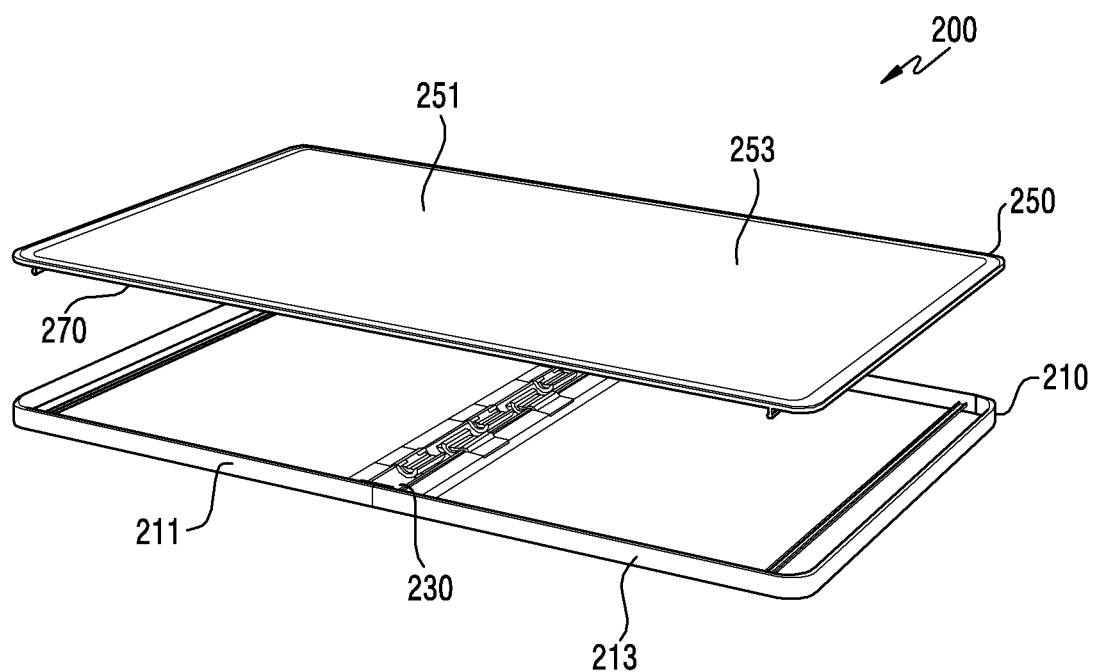
FIG. 2 illustrates a foldable electronic device in which a foldable display and a housing thereof are separated from each other according to an embodiment.
Figure 3A:
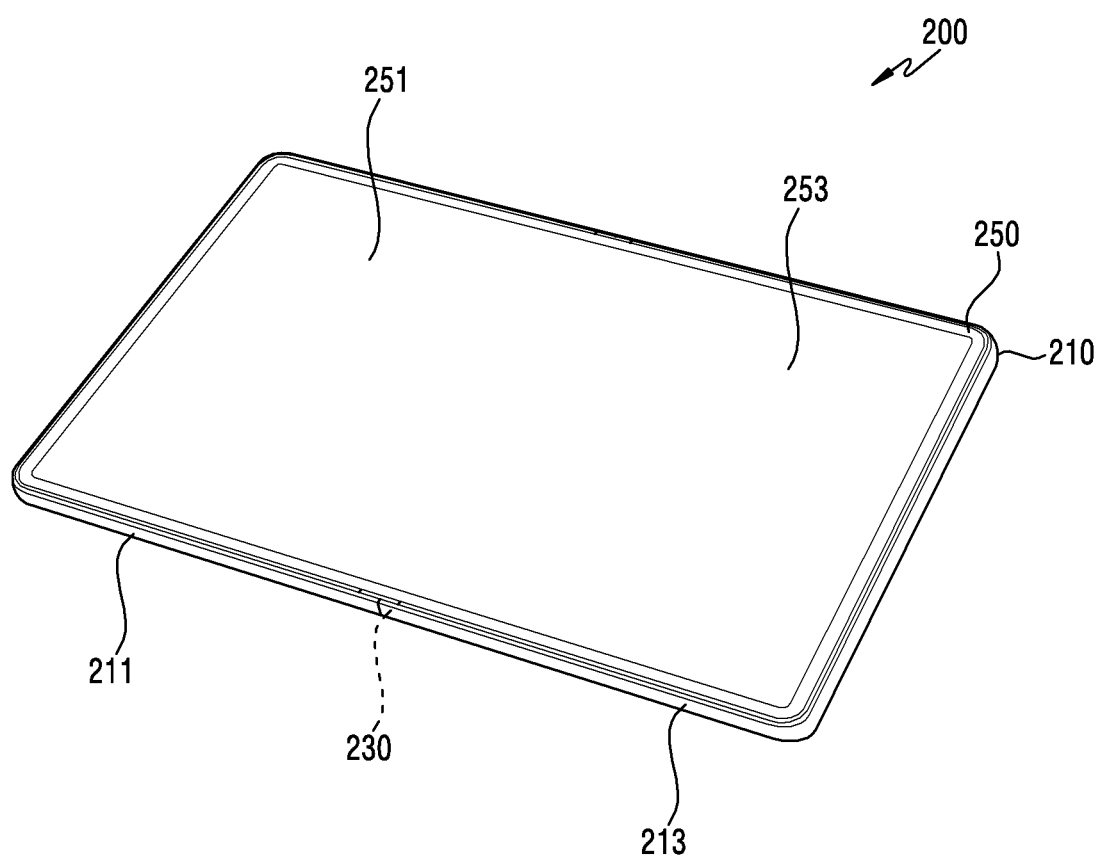
FIG. 3A illustrates a foldable electronic device in an unfolded state according to an embodiment.
Figure 3B:
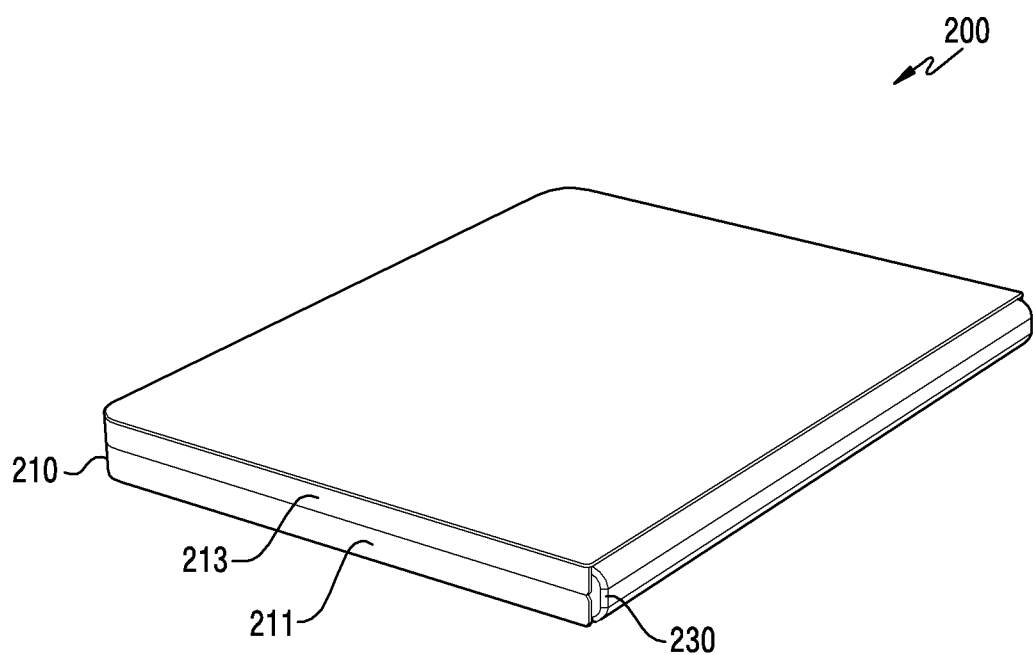
FIG. 3B illustrates a foldable electronic device in a folded state according to an embodiment.

FIG. 2 illustrates a foldable electronic device in which a foldable display and a housing thereof are separated from each other according to an embodiment. FIG. 3A illustrates a foldable electronic device in an unfolded state according to an embodiment. FIG. 3B illustrates a foldable electronic device in a folded state according to an embodiment.

Referring to FIGS. 2, 3A, and 3B, a foldable electronic device 200 includes a housing 210, a hinge structure 230, a flexible display 250, and a support plate 270. However, the configuration of the foldable electronic device 200 is not limited thereto. At least one of the above-described components may be omitted from the foldable electronic device 200, or the foldable electronic device 200 may further include one or more other components. For example, the foldable electronic device 200 may further include an outer display.

The housing 210 may form the exterior of the foldable electronic device 200, and may protect at least one surface of the foldable electronic device 200 from an external shock. The housing 210 may include a front surface (or a top surface), a rear surface (or a bottom surface), and a side surface partially surrounding the space between the front surface and the rear surface. The side surface is visually seen when a thin surface of the foldable electronic device 200 is viewed. The front surface is the surface on which a screen output through the flexible display 250 is exposed to the outside including a region other than the side surface. The rear surface faces away from the front surface. The screen of the flexible display 250 may be partially exposed to the outside through the rear surface and/or the side surface. The front surface may be provided such that most of the region thereof is capable of outputting the screen of the flexible display 250.

The housing 210 may fix or support the inner components of the foldable electronic device 200. The housing 210 may provide a space in which the inner components of the foldable electronic device 200 are capable of being seated, and may fix or support the seated components.

The housing 210 includes a first part 211 and a second part 213, which are physically separated from each other. The first part 211 and the second part 213 are connected via the hinge structure 230, and are pivotable with respect to each other by the hinge structure 230.

The hinge structure 230 connects the first part 211 and the second part 213, and may enable the first part 211 and/or the second part 213 to be pivoted such that the flexible display 250 seated on the first part 211 and the second part 213 is capable of being folded or unfolded. The hinge structure 230 may be disposed below the portion in which the flexible display 250 is folded. Accordingly, the extent to which the hinge structure 230 is exposed to the exterior of the foldable electronic device 200 may be minimized, and the flexible display 250 may occupy most of the region of the front surface of the foldable electronic device 200.

The hinge structure 230 may have a sliding structure. For example, the hinge structure 230 includes a hinge provided in a semi-cylindrical shape that performs a sliding motion inside the hinge structure 230, instead of a cylindrical hinge that is rotated. Accordingly, the thickness of the hinge structure 230 may be minimized, and the overall thickness of the foldable electronic device 200 may also be minimized.

The flexible display 250 may display various contents (e.g., a text, an image, a video, an icon, or a symbol) to the user. The flexible display 250 may include a display panel, a touch panel provided on or integrally formed on the display panel, and a window layer provided on the touch panel. The display panel, the touch panel, and the window layer may be attached to each other by a pressure-sensitive adhesive (PSA).

The window layer may include a highly flexible, highly hard, and transparent plastic film for manufacturing the flexible display 250 having flexibility. The plastic film may include a polyimide or polyethylene terephthalate (PET) film. The window layer may include a plurality of plastic films, which may be attached to each other via a pressure-sensitive adhesive.

The display panel may include a flexible display substrate, a plurality of display elements coupled to the display substrate, at least one conductive line coupled to the display substrate and electrically connected to the display elements, and a thin film encapsulation layer. The display substrate may include a flexible plastic material, but is not limited thereto. The display substrate may include various materials having a flexible property.

The display elements may be disposed on the display substrate and may form a plurality of pixels. The display elements may be arranged in a matrix form on the display substrate in order to form the pixels of the display panel, and may include a fluorescent material or an organic fluorescent material that is capable of expressing colors. The display elements may include an organic light-emitting diode (OLED).

The conductive line may include at least one gate signal line or at least one data signal line. The conductive line may include a plurality of gate signal lines and a plurality of data signal lines. The gate signal lines and the data signal lines may be arranged in a matrix form. The display elements may be aligned adjacent to points at which the lines intersect, and the display elements may be electrically connected to the lines.

The thin film encapsulation layer may cover the display substrate, the display elements, and the conductive lines, in order to prevent inflow of oxygen and moisture from the outside. The thin film encapsulation layer may be formed by stacking one or more organic layers and one or more inorganic layers alternately. In this case, the uppermost layer exposed to the outside of the thin film encapsulation layer may be formed using an inorganic layer in order to prevent moisture permeation.

The flexible display 250 may include a polarization film disposed between the display panel and the touch panel. The polarization film may reduce thickness and may improve visibility of an image while securing a flexible characteristic. The flexible display 250 may include a phase delay film between the display panel and the window layer. The phase delay film may change linearly polarized light into circularly polarized light or change circularly polarized light into linearly polarized light. The flexible display 250 may include a cushion layer attached to the lower portion of the display panel via an adhesive tape or a pressure-sensitive adhesive.

The flexible display 250 may be seated on the housing 210. The first region 251 of the flexible display 250 may be seated on the first part 211 of the housing 210, and the second region 253 of the flexible display 250 may be seated on the second part 213 of the housing 210.

The flexible display 250 may be folded or unfolded using the hinge structure 230. When the foldable electronic device 200 is fully unfolded, the first region 251 and the second region 253 of the flexible display 250 may be substantially flush with each other. When the foldable electronic device 200 is folded, the first region 251 and the second area 253 of the flexible display 250 may face each other. When the foldable electronic device 200 is partially unfolded by a first angle, the first region 251 and the second region 253 of the flexible display 250 may form the first angle between each other.

The support plate 270 may be attached to the rear surface of the flexible display 250 to support the flexible display 250. The support plate 270 may support the flexible display 250 such that, when the flexible display 250 is folded or unfolded in the portion in which the flexible display 250 overlaps the hinge structure 230 during the opening/closing operation of the foldable electronic device 200, a portion other than the overlapping portion is prevented from being folded or bent. The support plate 270 may include a first support plate attached to the flexible plate 250 in order to at least partially overlap the first region 251 between the first part 211 of the housing 210 and the first region 251 of the flexible display 250, and a second support plate attached to the flexible display 250 in order to at least partially overlap the second region 253 between the second part 213 of the housing 210 and the second region 253 of the flexible display 250.

Figure 4A:
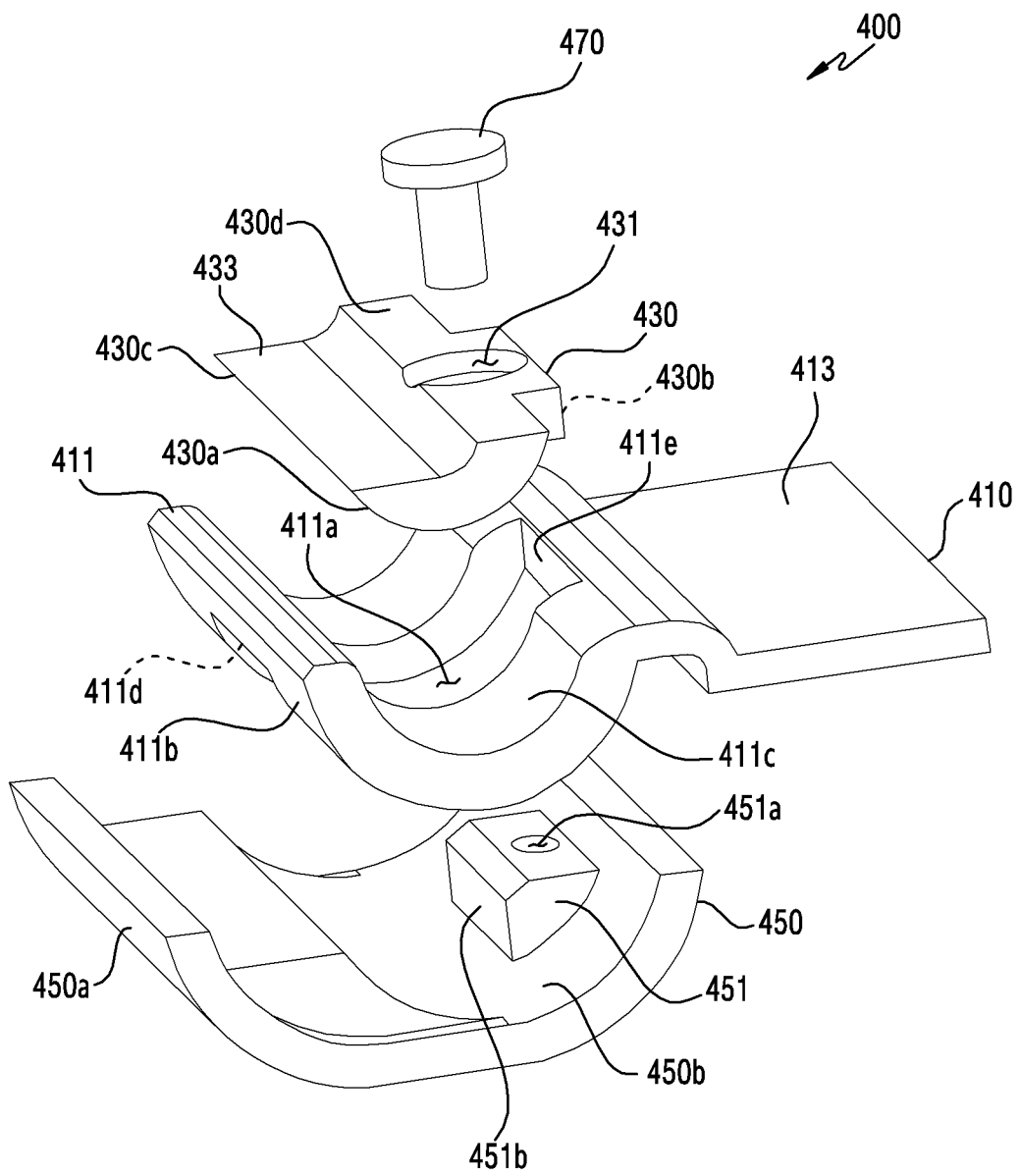
FIG. 4A illustrates a hinge structure in a disassembled state according to an embodiment.
Figure 4B:
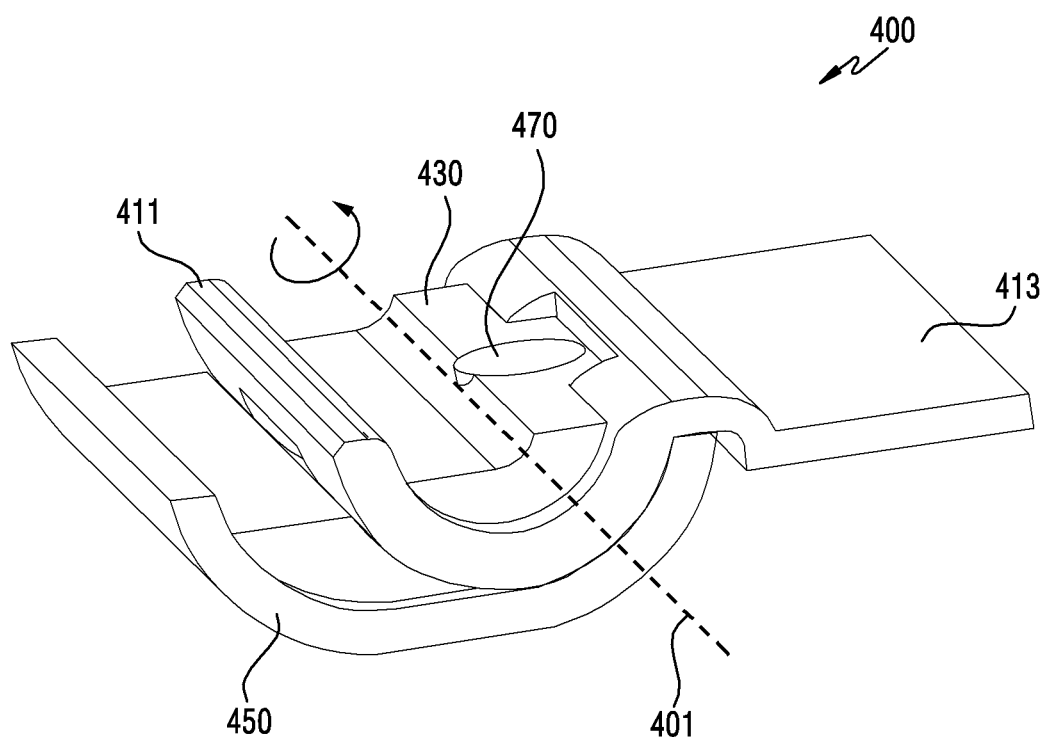
FIG. 4B illustrates a hinge structure in an assembled state according to an embodiment.

FIG. 4A illustrates a hinge structure in a disassembled state according to an embodiment, and FIG. 4B illustrates a hinge structure in an assembled state according to an embodiment.

Referring to FIGS. 4A and 4B, a hinge structure 400 includes a hinge member 410, a guide member 430, and a hinge housing 450. The hinge member 410 includes a sliding part 411 and a connection part 413 extending from the sliding part 411 and connected to a first part or a second part of a housing. The guide member 430 may be coupled to the hinge housing 450 to form a space between the guide member 430 and the hinge housing 450. A part of the hinge member 410 may be located in a space between the guide member 430 and the hinge housing 450. The hinge housing 450 may cover the hinge member 410 and the guide member 430 in order to protect the hinge member 410 and the guide member 430 from an external impact.

The sliding part 411 may be inserted into a space between the guide member 430 and the hinge housing 450 and may perform a sliding motion between the guide member 430 and the hinge housing 450. More specifically, a rear surface 411b of the sliding part 411 may slide on a front surface 450b of the hinge housing 450, which faces the rear surface 411b. A front surface 411c of the sliding part 411 may slide on a rear surface 430a of the guide member 430, which faces the front surface 411c.

Since the sliding part 411 slides, the hinge structure 400 may rotate the first part or the second part connected to the connection part 413 about the central axis 401. When the sliding part 411 slides between the guide member 430 and the hinge housing 450, the guide member 430 and the hinge housing 450 may provide a frictional force in order to stop the sliding part 411 at a position desired by the user while firmly holding the sliding part 411.

The sliding part 411 and the guide member 430 may be configured such that the surfaces thereof facing each other have substantially the same curvature. For example, the front surface 411c of the sliding part 411 and the rear surface 430a of the guide member 430 may include curved surfaces, which have substantially the same curvature. In addition, the sliding part 411 and the hinge housing 450 may be configured such that the surfaces thereof facing each other have substantially the same curvature. For example, the rear surface 411b of the sliding part 411 and the front surface 450b of the hinge housing 450 may include curved surfaces, which have substantially the same curvature.

The sliding part 411 may have a half-ring shape, and the guide member 430 may have a semi-cylindrical shape. In addition, the hinge housing 450 may be disposed between the first part and the second part of the housing, and a portion of the front surface 450b may be provided in a shape recessed toward the rear surface 450a. The hinge housing 450 may include a curved surface integrally connected from one side surface to the other side surface. The curved surface may have a substantially straight-line shape when viewed in an axial cross section of the foldable electronic device, but may have a substantially half-ring shape when viewed in a cross section taken in a direction perpendicular to the axis. For example, the hinge housing 450 may be provided in a dome shape extending in the axial direction in which the foldable electronic device is folded.

The sliding part 411 includes an opening 411a formed in a central portion thereof, extending in the direction in which the sliding part 411 slides. For example, the sliding part 411 includes an opening 411a opened from a first position spaced apart from a side surface thereof facing the connection part 413 by a predetermined distance to a second position spaced apart from the other side surface thereof by a predetermined distance. The opening 411a may be formed in a half-ring shape like the shape of the sliding part 411.

The sliding part 411 may be configured such that, when an foldable electronic device is unfolded and a first region and a second region of a flexible display are substantially flush with each other, one end of the sliding part 411 (the portion opposite where the connection part 413 extends) may be drawn out from the space between the guide member 430 and the hinge housing 450 and may support the flexible display.

The guide member 430 includes a first screw hole 431 penetrated from the front surface to the rear surface thereof. The hinge housing 450 includes a second screw hole 451a formed in a predetermined depth from the front surface towards the rear surface. A screw member 470 may be inserted into the first screw hole 431 and the second screw hole 451a in order to couple the guide member 430 to the hinge housing 450.

The first screw hole 431 may be disposed at a position eccentric from the central portion of the guide member 430 towards the connection part 413. The screw member 470 may fix the guide member 430 at an eccentric position rather than in the central portion of the guide member 430. In this case, since the screw member 470 presses the guide member 430 at the eccentric position rather than in the central portion of the guide member 430, when the sliding part 411 slides, the frictional force in a region adjacent to the connection part 413 may be greater than the frictional force in a region adjacent to the central portion of the hinge housing 450. Accordingly, when the user fully unfolds the foldable electronic device, the flexible display may be maintained at an angle desired by the user due to the frictional force in the region adjacent to the connection part 413. In addition, because the screw member 470 is inserted at an eccentric position instead of the central portion of the guide member 430, a space is created in which the folded portion of the flexible display may be located when the flexible display is folded.

Because the screw member 470 presses the guide member 430 at the eccentric position rather than in the central portion, the spacing distance between the guide member 430 and the hinge housing 450 may become smaller towards the region adjacent to the connection part 413.

The sliding part 411 may have a first portion, from which the connection part 413 extends, and a second portion located opposite the first portion, in which the thickness of the second portion may be greater than that of the first portion. Because the screw member 470 presses the guide member 430 at the eccentric position, the spacing distance between the guide member 430 and the hinge housing 450 may become smaller towards the region adjacent to the connection part 413, and due to the thickness of the second portion of the sliding part 411 being greater than that of the first portion, it may be easier to unfold the foldable electronic device than to fold the foldable electronic device. For example, when the foldable electronic device is folded, the second portion of the sliding part 411 may enter a region where the spacing between the guide member 430 and the hinge housing 450 is narrow. The second portion is tightly fitted to the space between the guide member 430 and the hinge housing 450, and a greater force may be required to move the second portion. However, when the foldable electronic device is unfolded, the sliding part 411 slides away from the connection part 413, and at this time, the second portion of the sliding part 411 moves in the direction in which the space between the guide member 430 and the hinge housing 450 becomes wider, allowing the user to unfold the foldable electronic device with less force. When the foldable electronic device is folded, the second portion of the sliding part 411 may be relatively firmly fixed between the guide member 430 and the hinge housing 450, allowing the user to maintain the flexible display at a desired angle.

From one end 430c adjacent to the central portion of the hinge housing 450 to a portion that forms the central axis 401 of the hinge structure 400, the guide member 430 may include a recess portion 433 formed as the guide member 430 is recessed from the front surface 430d facing the flexible display towards the rear surface 430a. The recess portion 433 may be configured such that, when the foldable electronic device is folded or unfolded, the flexible display and the support plate that supports the flexible display do not interfere with the guide member 430.

The hinge housing 450 includes a limiting portion 451 protruding on the front surface 450b, facing the sliding part 411. The limiting portion 451 may be located in the opening 411a of the sliding part 411 in order to guide the sliding motion of the sliding part 411, and may limit the sliding range of the sliding part 411. When the foldable electronic device is folded, the movement of the sliding part 411 may be limited because one side wall 411d formed by the opening 411a is engaged with a vertical surface 451b of the limiting part 451. When the foldable electronic device is folded, the movement of the sliding part 411 may be limited as the other side wall 411e formed by the opening 411a contacts the side surface 430b of the guide member 430.

The hinge housing 450 may form the exterior of the foldable electronic device with the housing. When the foldable electronic device is unfolded, e.g., as illustrated in FIG. 3A, the hinge housing 450 may be covered by the first part and the second part of the housing such that the hinge housing 450 may not be exposed to the outside of the electronic device, and when the foldable electronic device is folded, e.g., as illustrated in FIG. 3B, the first and second parts of the housing pivot with respect to each other, and the rear surface 450a of the hinge housing 450 may be exposed to the outside of the electronic device.

Figure 5A:
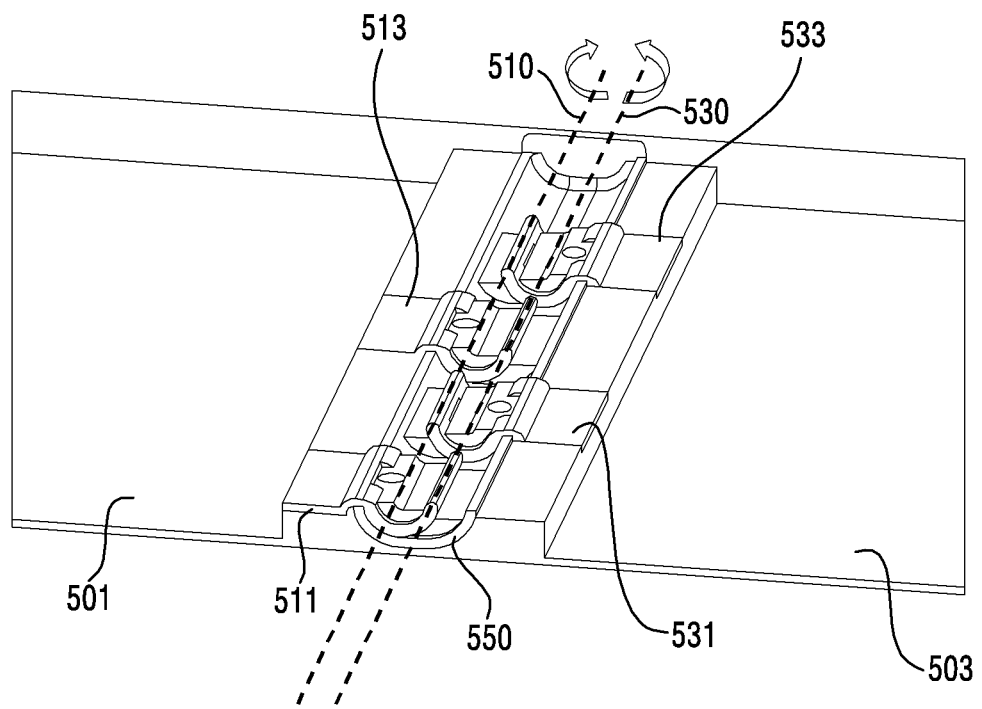
FIG. 5A illustrates a sliding motion of a hinge structure according to an opening/closing operation of a foldable electronic device according to an embodiment.
Figure 5B:
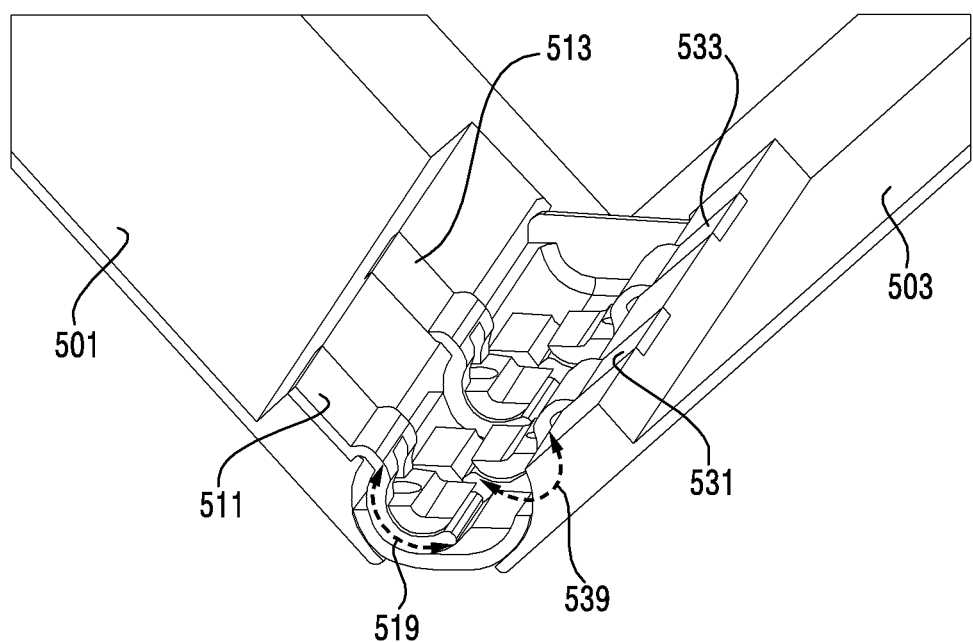
FIG. 5B illustrates a sliding motion of a hinge structure according to an opening/closing operation of a foldable electronic device according to an embodiment.
Figure 5C:
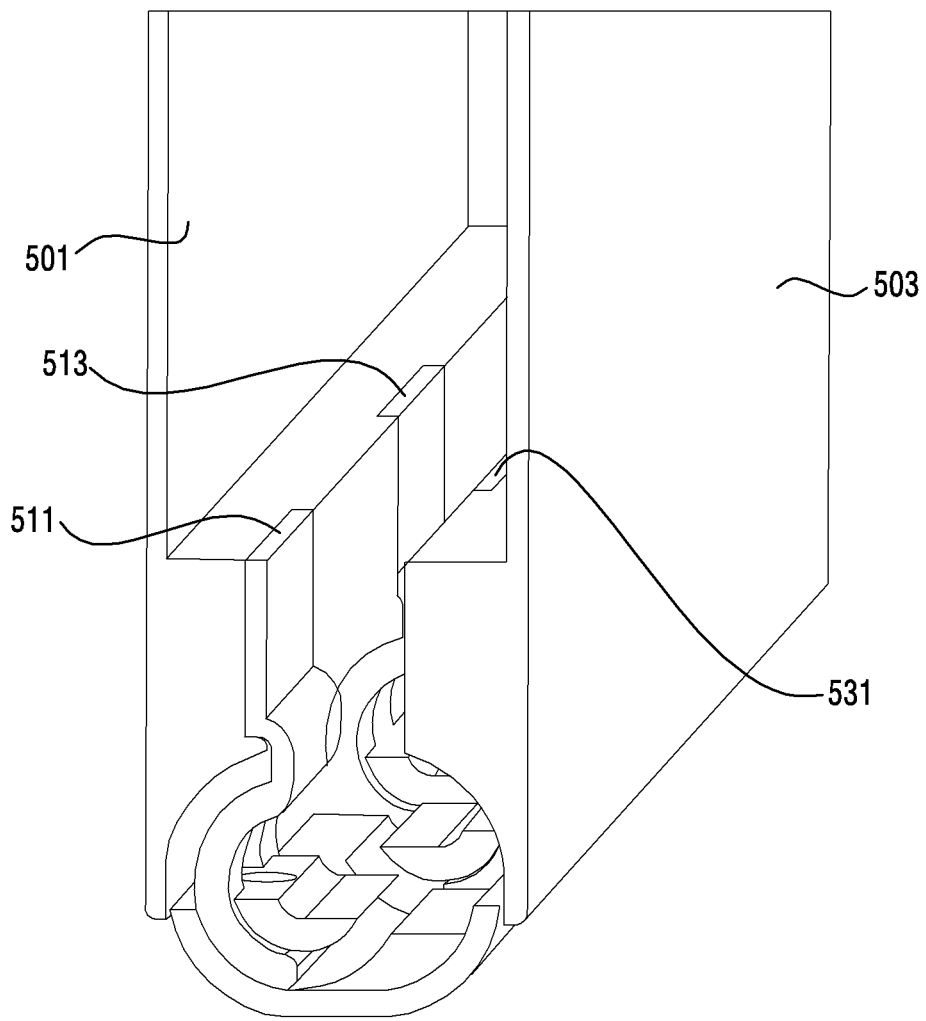
FIG. 5C illustrates a sliding motion of a hinge structure according to an opening/closing operation of a foldable electronic device according to an embodiment.

FIG. 5A illustrates a sliding motion of a hinge structure according to an opening/closing operation of a foldable electronic device according to an embodiment. FIG. 5B illustrates a sliding motion of a hinge structure according to an opening/closing operation of a foldable electronic device according to an embodiment. FIG. 5C illustrates a sliding motion of a hinge structure according to an opening/closing operation of a foldable electronic device according to an embodiment.

Referring to FIGS. 5A, 5B, and 5C, a foldable electronic includes a plurality of hinge structures 511, 513, 531, and 533. The foldable electronic device may include one or more hinge structures (e.g., a first hinge structure 511 and a second hinge structure 513), which are fastened to a first part 501 of a housing in order for the first part 501 to pivot about a first axis 510, and one or more hinge structures (e.g., a third hinge structure 531 and a fourth hinge structure 533), which are fastened to a second part 503 of the housing in order for the second part 503 to pivot about a second axis 530.

The hinge structures 511 and 513, which allow the first part 501 to pivot about the first axis 510, are fastened to the first part 501 via connection parts thereof. In addition, the hinge structures 531 and 533, which allow the second part 503 to pivot about the second axis 530, are fastened to the second part 503 via connection parts thereof.

The plurality of hinge structures 511, 513, 531, and 533 share a hinge housing 550. The hinge housing 550 may be provided in a dome shape extending in the axial direction (the first axis 510 and the second axis 530) in which the foldable electronic device is folded between the first part 501 and the second part 503.

In the hinge structures 511 and 513 fastened to the first part 501, a sliding part may perform a sliding motion 519 about the first axis 510 between the guide member and the hinge housing 550. In the hinge structures 531 and 533 fastened to the second part 503, a sliding part may perform a sliding motion 539 about the second axis 530 between the guide member and the hinge housing 550.

The direction of the sliding motion 519 of the sliding part included in the hinge structures 511 and 513, which allow the first part 501 to pivot, may be opposite the direction of the sliding motion 539 of the sliding part included in the hinge structures 531 and 533, which allow the second part 503 to pivot. For example, when the first part 501 is located on the left side of the second part 503 while the foldable electronic device is folded (e.g., as illustrated from FIGS. 5A to FIG. 5C), the direction of the sliding motion 519 of the sliding part, which is engaged in the pivot of the first part 501, may be a clockwise direction about the first axis 510, and the direction of the sliding movement 539 of the sliding part, which is engaged in the pivot of the second part 503, may be a counterclockwise direction about the second axis 530. However, when the first part 501 is located on the left side of the second part 503 while the foldable electronic device is unfolded (e.g., as illustrated from FIGS. 5C to FIG. 5A), the direction of the sliding motion 519 of the sliding part, which is engaged in the pivot of the first part 501, is the counterclockwise direction about the first axis 510, and the direction of the sliding movement 539 of the sliding part, which is engaged in the pivot of the second part 503, may be the clockwise direction about the second axis 530.

Figure 6:
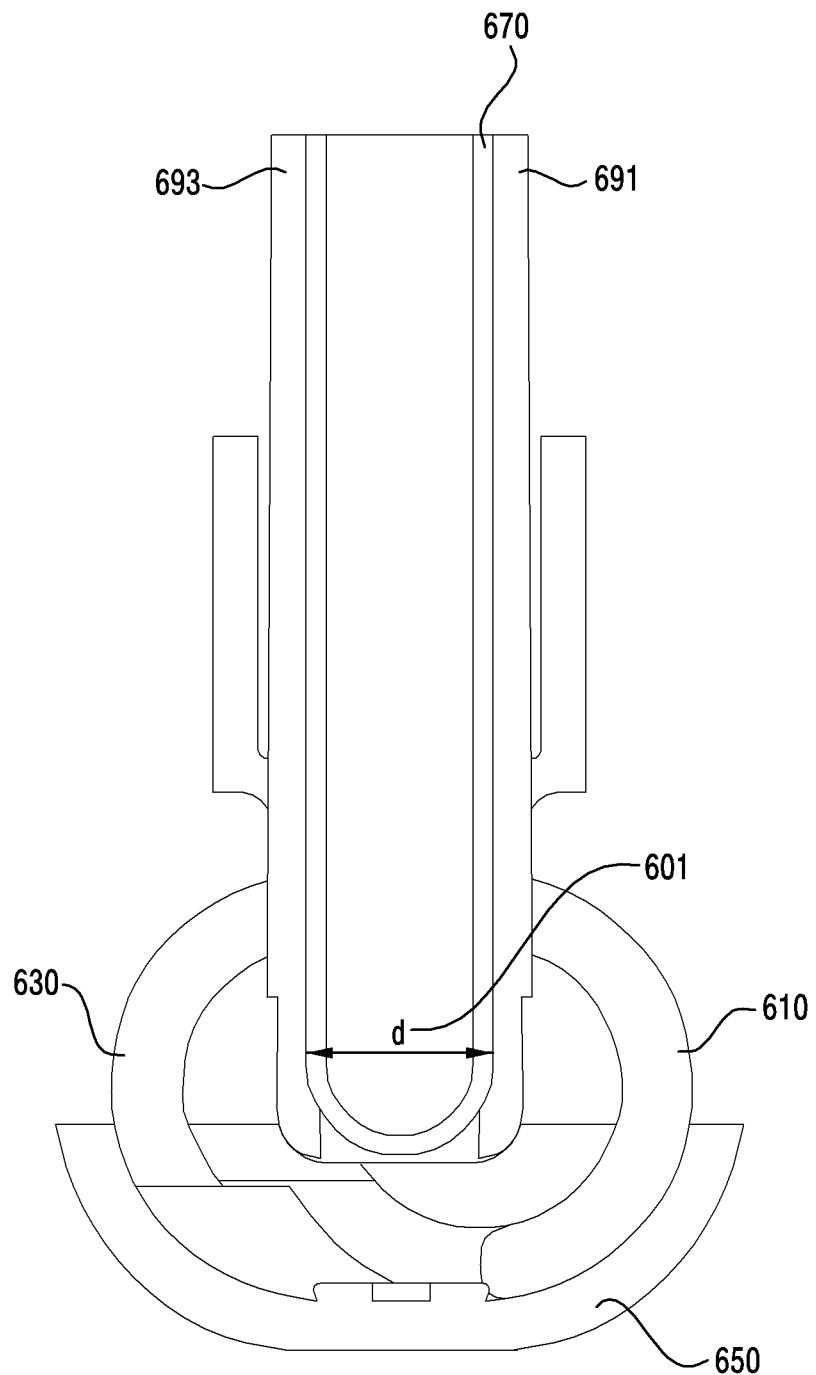
FIG. 6 illustrates an arrangement structure of a foldable display according to an embodiment.

FIG. 6 illustrates an arrangement structure of a foldable display according to an embodiment.

Referring to FIG. 6, a foldable electronic device includes a plurality of hinge structures 610 and 630. The first hinge structure 610, which is fastened to a first part of a housing, allows the first part to pivot about a first axis, and the second hinge structure 630, which is fastened to a second part of the housing, allows the second part to pivot about a second axis. The plurality of hinge structures 610 and 630 share a hinge housing 650, which may be provided in a dome shape extending in the axial direction in which the foldable electronic device is folded between the first part and the second part.

The first axis and second axis may be spaced apart from each other by a predetermined distance (d) 601. More specifically, the first axis, which serves as the central axis of the sliding motion of the first sliding part included in the first hinge structure 610, and the second axis, which serves as the central axis of the sliding motion of the second sliding part included in the second hinge structure 630, may be spaced apart from each other by the predetermined distance 601. Accordingly, when the foldable electronic device is folded, because the first sliding part and the second sliding part face each other at a predetermined distance from each other, a space is available for accommodating a flexible display 670 therein between the first sliding plate and the second sliding part.

The spacing distance 601 between the first axis and second axis may be set in consideration of the folding curvature of the flexible display 670. When the foldable electronic device is folded, a spacing distance between the first sliding part and the second sliding part may be set in proportion to the folding curvature of the flexible display 670. As the folding curvature of the flexible display 670 increases, the distance 601 between the first axis and the second axis may increase corresponding to the increase of the folding curvature.

The foldable electronic device includes support plates 691 and 693, which support the flexible display 670, and the spacing distance 601 between the first axis and the second axis may be set in consideration of the thicknesses of the support plates 691 and 693.

Figure 7:
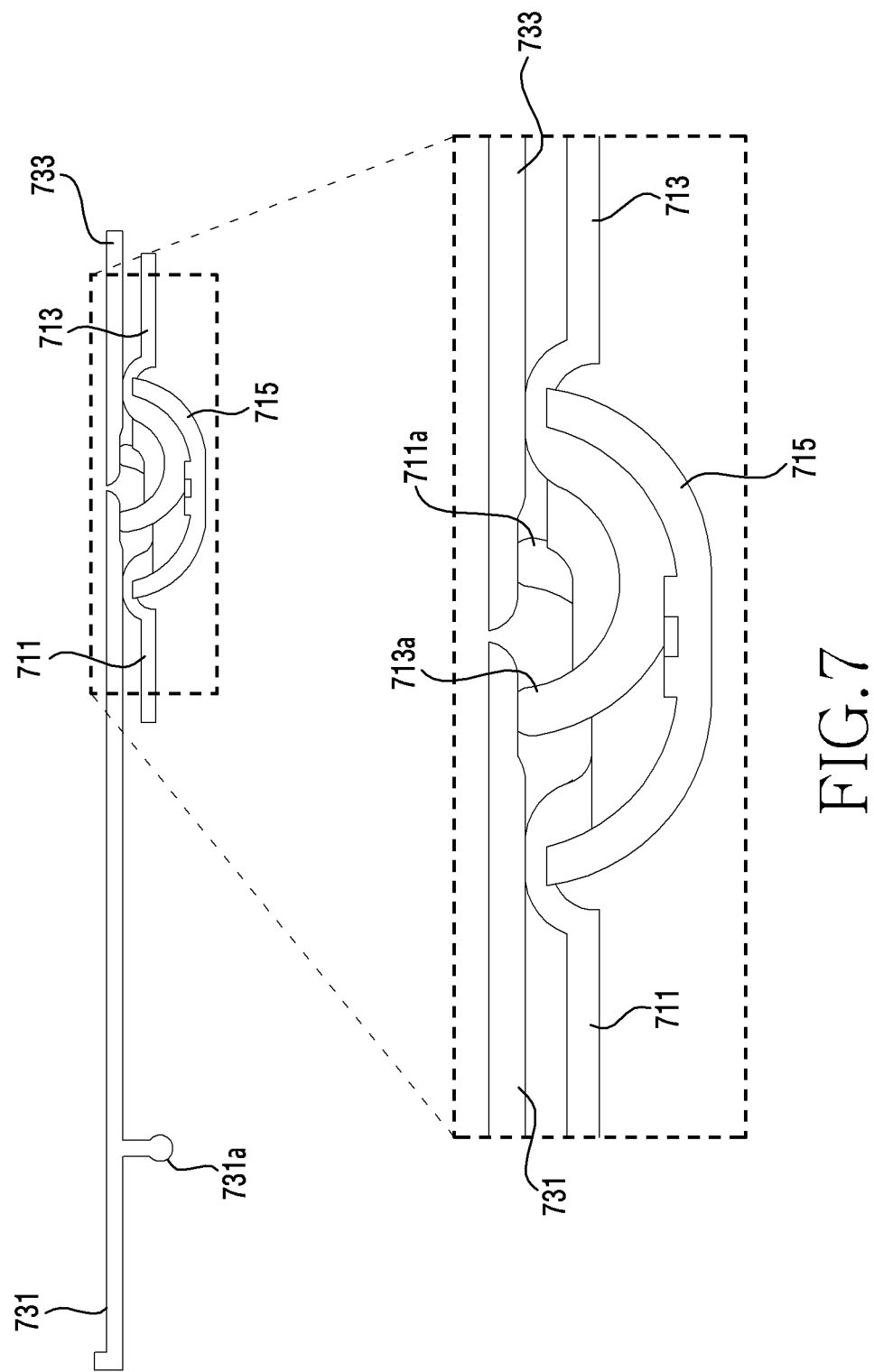
FIG. 7 illustrates a horizontal structure of a foldable display in an unfolded foldable electronic device according to an embodiment.

FIG. 7 illustrates a horizontal structure of a foldable display in an unfolded foldable electronic device according to an embodiment.

Referring to FIG. 7, when fully unfolded, the foldable electronic device provides a flexible display in a substantially horizontal position. More specifically, when the foldable electronic device is unfolded, sliding parts 711 and 713 included in a hinge structure may perform a sliding motion between a hinge housing 715 and a guide member. First ends 711a and 713a of the sliding parts 711 and 713 (the portions opposite the portion in which the connection part extends) may be drawn out of the space between the hinge housing 715 and the guide member in order to raise the flexible display or support plates 731 and 733, which support the flexible display, to support the support plates 731 and 733, such that the flexible display is horizontal.

A foldable electronic device may include a plurality of hinge structures, and one or more of the plurality of hinge structures may allow a first part of a housing to rotate, and one or more other hinge structures may allow a second part of the housing to rotate. When the foldable electronic device is unfolded, a first end 711a of the first sliding part 711, which is engaged in the rotation of the first part, is drawn out of the space between the hinge housing 715 and the guide member so as to raise a second region of the flexible display seated on the second part or a second support plate 733 attached to the lower surface of the second region, and one end 713a of the second sliding part 713, which is engaged in the rotation of the first part, is drawn out of the space between the hinge housing 715 and the guide member in order to raise a first region of the flexible display seated on the first part or a first support plate 731 attached to the lower surface of the first region, whereby the first region and the second region may be substantially flush with each other.

The support plate 731 includes at least one support portion 731a protruding from the rear surface. The support plate 733 may also include at least one support protrusion. The support portion 731a may protrude towards the housing and may be fastened to the first part or the second part of the housing in order to separate the first part or the second part from support plates 731 and 733 by a predetermined distance.

When the foldable electronic device is fully unfolded, the horizontal structure of the flexible display may be determined and maintained by the height by which the flexible display or the support plates 731 and 733 are raised by the first ends 711a and 713a of the sliding parts 711 and 713 and the spacing distance formed between the support plates 731 and 733 and the housing by the support portion 731a. Accordingly, the length of the support portion 731a protruding from the rear surfaces of the support plates 731 and 733 may be determined based on the height by which the flexible display or the support plates 731 and 733 are raised by the first ends 711a and 713a of the sliding parts 711 and 713, when the foldable electronic device is fully unfolded. The protruding length of the support portion 731a may be proportional to the height by which the flexible display or the support plates 731 and 733 are raised by the first ends 711a and 713a of the sliding parts 711 and 713, when the foldable electronic device is fully unfolded.

Various electronic components included in the foldable electronic device or a PCB on which electronic components are mounted may be disposed in the space formed between the support plates 731 and 733 and the housing by the support portion 731a. The electronic components or the PCB may be electrically connected to the flexible display.

For example, one or more electronic elements or circuit lines may be mounted on the PCB, and at least some of the electronic elements or circuit lines may be electrically connected to each other. The electronic elements may include a processor, a memory, a power management integrated circuit, and/or a communication circuit.

The PCB may be integrally disposed in the space formed between the support plates 731 and 733 and the housing. The PCB may be made of a flexible material.

The PCB may include at least two physically separated PCBs. For example, a first PCB may be disposed in a space formed between the first support plate 731 and the housing, and a second PCB may be disposed in a space between the second support plate 733 and the housing. The first PCB and the second PCB may be electrically connected to each other.

Figure 8:
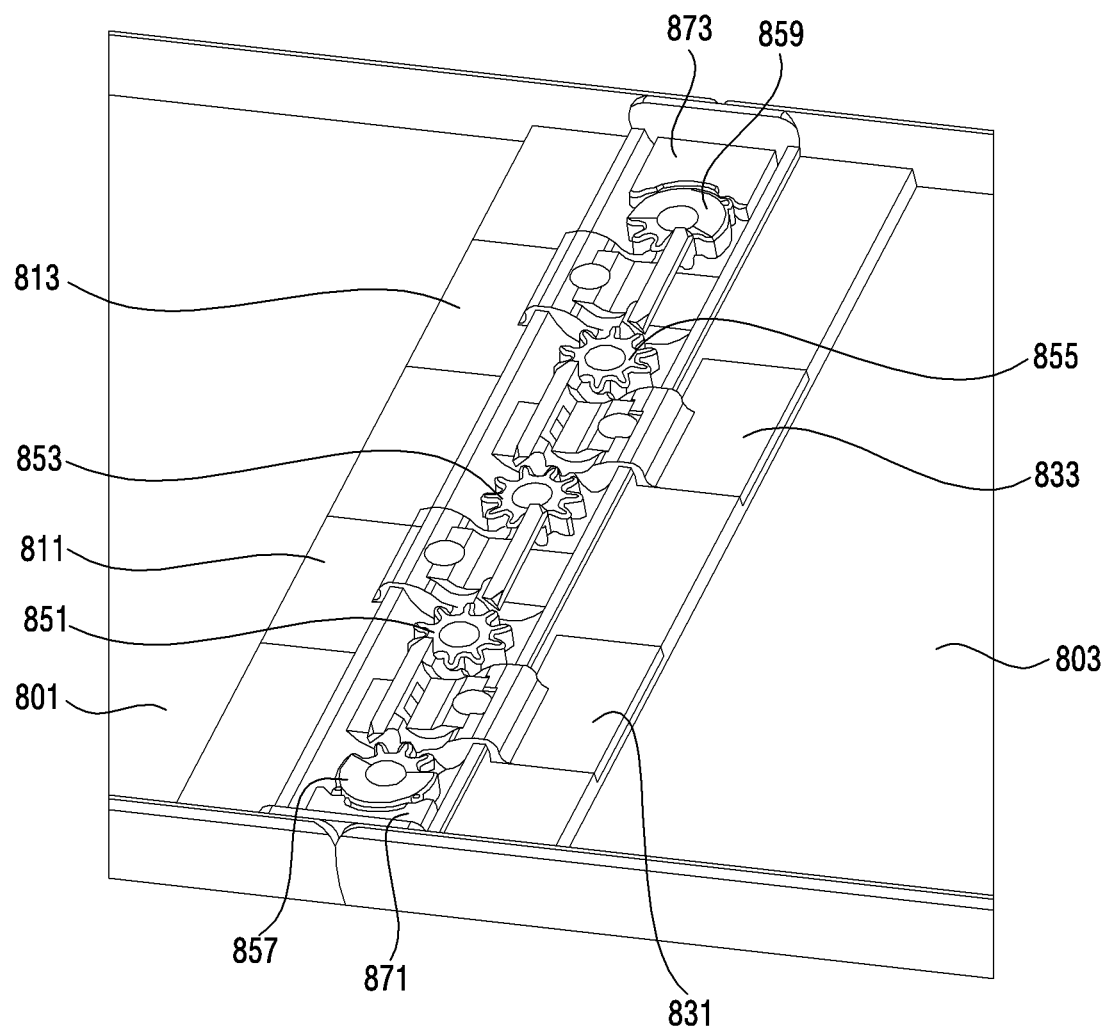
FIG. 8 illustrates a foldable electronic device having gears disposed between a plurality of hinge structures according to an embodiment.
Figure 9:
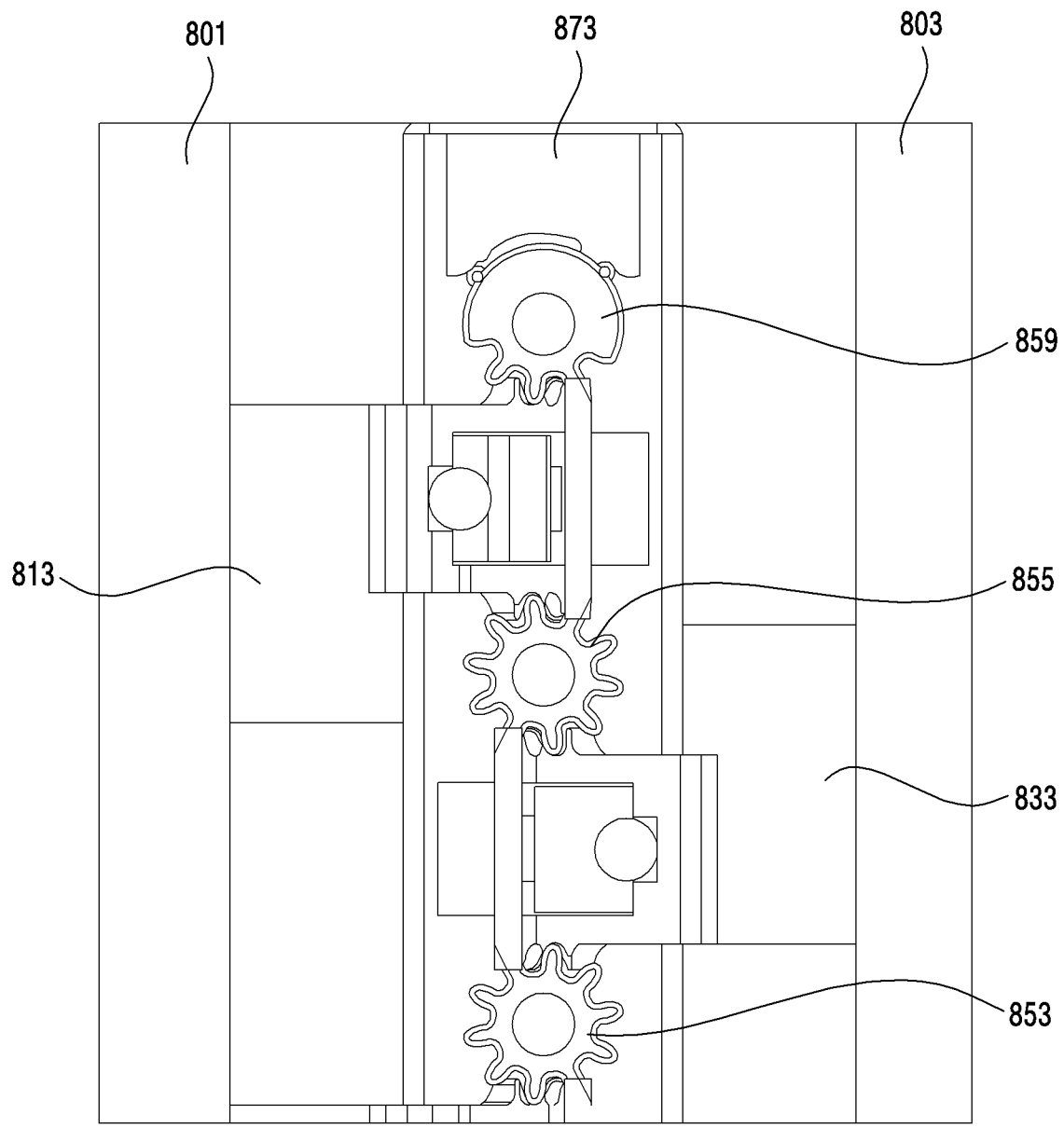
FIG. 9 illustrates a foldable electronic device having gears disposed between a plurality of hinge structures according to an embodiment.

FIG. 8 illustrates a foldable electronic device including gears disposed between a plurality of hinge structures according to an embodiment. FIG. 9 illustrates components of a foldable electronic device including gears disposed between a plurality of hinge structures according to an embodiment.

Referring to FIGS. 8 and 9, a foldable electronic device includes a plurality of hinge structures 811, 813, 831, and 833 and gears 851, 853, and 855 disposed between the plurality of hinge structures 811, 813, 831, and 833. Although the foldable electronic device illustrated in FIG. 8 includes a first hinge structure 811, a second hinge structure 813, a third hinge structure 831, a fourth hinge structure 833, a first gear 851, a second gear 853, and a third gear 855, the disclosure is not limited to the number of hinge structures and the number of gears used in this example.

In FIG. 8, hinge structures 811 and 813 are connected to a first part 801 of a housing, allowing the first part 801 to rotate. Similarly, hinge structures 831 and 833 are connected to a second part 803 of the housing, allowing the second part 803 to rotate.

The hinge structures 811 and 813 connected to the first part 801 and the hinge structures 831 and 833 connected to the second part 803 may be alternately disposed. For example, as illustrated in FIG. 8, the third hinge structure 831, the first hinge structure 811, the fourth hinge structure 833, and the second hinge structure 813 are arranged in this order. The first gear 851 is disposed between the first hinge structure 811 and the third hinge structure 831, the second gear 853 is disposed between the first hinge structure 811 and the fourth hinge structure 833, and the third gear 855 is disposed between the fourth hinge structure 833 and the second hinge structure 813.

The gears 851, 853, and 855 may gear-couple the hinge structures 811, 813, 831, and 833 disposed at the opposite sides thereof. The gear teeth of the gears 851, 853, and 855 may be engaged with the gear teeth of the hinge structures 811, 813, 831, and 833 disposed on the opposite sides of the gears 851, 853, 855 and thus, the gears 851, 853, and 855 and the hinge structures 811, 813, 831 and 833 disposed on the opposite side of the gears 851, 853 and 855 may rotate simultaneously.

The sliding parts included in the hinge structures 811, 813, 831, and 833 arranged on the opposite sides of the gears 851, 853, and 855 may include gear portions disposed on the side surfaces in the direction, in which the gears 851, 853, and 855 are arranged, and engaged with the gears 851, 853, and 855. The gear portions may include gear teeth. The sliding part included in the first hinge structure 811 may include a first gear portion formed on the side surface in the direction, in which the first gear 851 is arranged, and engaged with the first gear 851 and a second gear portion formed on the side surface in the direction, in which the second gear 853 is arranged, and engaged with the second gear 853. The sliding part included in the second hinge structure 813 may include a third gear portion formed on the side surface in the direction, in which the third gear 855 is arranged, and engaged with the third gear 855. The sliding part included in the third hinge structure 831 may include a fourth gear portion formed on the side surface in the direction, in which the first gear 851 is arranged, and engaged with the first gear 851. The sliding part included in the fourth hinge structure 833 may include a fifth gear portion formed on the side surface in the direction, in which the second gear 853 is arranged, and engaged with the second gear 853 and a sixth gear portion formed on the side surface in the direction, in which the third gear 855 is arranged, and engaged with the third gear 855.

The sliding parts included in the hinge structures 811, 813, 831, and 833 arranged on the opposite sides of the gears 851, 853, and 855 may slide in different directions by the rotation of the gears 851, 853, and 855. When the gears 851, 853, and 855 rotate, the sliding parts, which are connected to one sides of the gears 851, 853, and 855 and engaged in the rotation of the first part 801, may slide clockwise (or counterclockwise), and the sliding parts connected to the other sides of the gears 851, 853, and 855 and engaged in the rotation of the second part 803, may slide counterclockwise (or clockwise). Accordingly, the first part 801 and the second part 803 may rotate towards each other when the foldable electronic device is folded, or the first part 801 and the second part 803 may rotate away from each other when the foldable electronic device is unfolded.

The foldable electronic device further includes gears 857 and 859 disposed adjacent to the hinge structures 813 and 831 disposed at an outer side among the plurality of hinge structures 811, 813, 831 and 833. More specifically, a fourth gear 857 is arranged adjacent to the third hinge structure 831, and a fifth gear 859 is arranged adjacent to the second hinge structure 813. The fourth gear 857 may be located in a direction opposite the first gear 851 with respect to the third hinge structure 831, and the fifth gear 859 may be located in a direction opposite the third gear 855 with respect to the second hinge structure 813. In this case, the sliding part included in the third hinge structure 831 may include a seventh gear portion formed on the side surface in the direction, in which the fourth gear 857 is arranged, and engaged with the fourth gear 857, and the sliding part included in the second hinge structure 813 may include an eighth gear portion formed on the side surface in the direction, in which the fifth gear 859 is arranged, and engaged with the fifth gear 859.

In each of the gears 857 and 859 arranged adjacent to the outer hinge structures 813 and 831, gear teeth may be formed in a first portion that is engaged with the gear portion of the sliding part, and no gear teeth may be formed in the portion other than the first portion. For example, each of the gears 857 and 859 may have gear teeth formed only in the first portion corresponding to the length of the gear portion of the sliding part engaged therewith.

The foldable electronic device includes rotation limiting portions 871 and 873 arranged in a direction opposite the outer hinge structures 813 and 831 with respect to the gears 857 and 859 arranged adjacent to the outer hinge structures 813 and 831. More specifically, a first rotation limiting portion 871 is arranged in a direction opposite the third hinge structure 831 with respect to the fourth gear 857, and a second rotation limiting portion 873 is arranged in a direction opposite the second hinge structure 813 with respect to the fifth gear 859.

The rotation limiting portions 871 and 873 may limit the rotation of the gears 857 and 859 disposed adjacent thereto. For example, when the rotation angles of the gears 857 and 859 disposed adjacent thereto are in a first angular range (e.g., 0 degrees to 165 degrees or 176 degrees or 180 degrees), the rotation limiting portions 871 and 873 may allow the gears 857 and 859 to rotate by an external force greater than or equal to a first magnitude, and when the rotation angles are in a second angular range (e.g., 166 degrees to 175 degrees), the rotation limiting portions 871 and 873 may allow the gears 857 and 859 to rotate by an external force greater than or equal a second magnitude, in which the second magnitude is greater than the first magnitude. That is, the rotation limiting portions 871 and 873 may maintain the open state of the foldable electronic device in the second angular range unless an external force greater than or equal to a predetermined magnitude is applied.

The rotation limiting portions 871 and 873 may include engagement portions protruding on the surfaces facing the gears 857 and 859 disposed adjacent thereto. While the foldable electronic device is folded or unfolded (i.e., while the first part 801 and/or the second part 803 pivot), the gears 857 and 859 are engaged with the engagement portions while rotating, and the rotation of the gears 857 and 859 may be limited such that the first part 801 and the second part 803 form a predetermined angle (e.g., about 172 degrees) therebetween. The gears 857 and 859 may include protrusions protruding from the second portions thereof facing the rotation limiting portions 871 and 873. For example, each of the gears 857 and 859 may have gear teeth formed in the first portion engaged with the gear portion of the sliding part, and may have a protrusion formed in the second portion facing the rotation limiting portions 871 and 873. Accordingly, while the foldable electronic device is folded or unfolded, the protrusions formed on the gears 857 and 859 are engaged with the engagement portions formed on the rotation limiting portions 871 and 873, and the first part 801 and the second part 803 may form a predetermined angle therebetween.

Figure 10A:
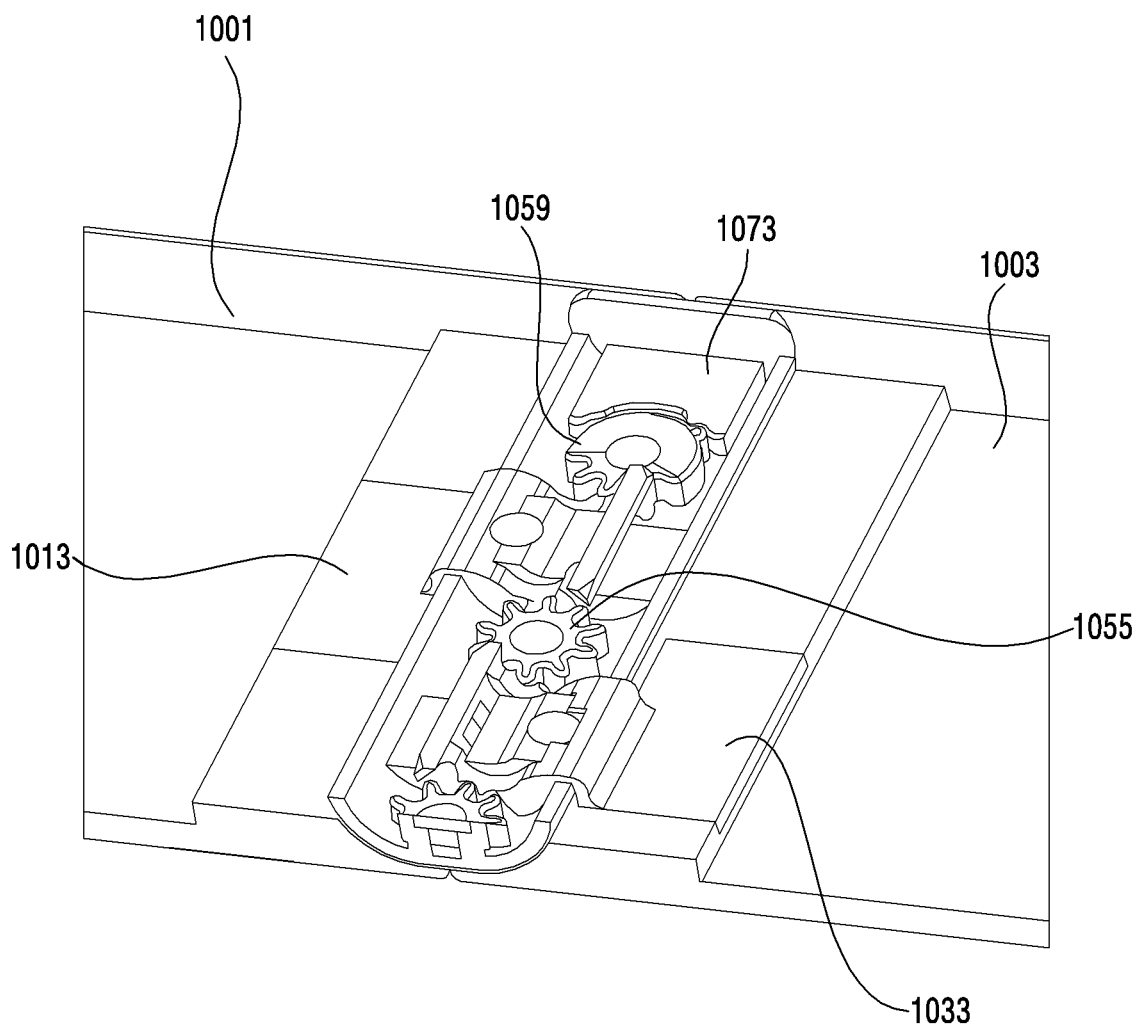
FIG. 10A illustrates operations of hinge structures and gears according to an opening/closing operation of a foldable electronic device according to an embodiment.
Figure 10B:
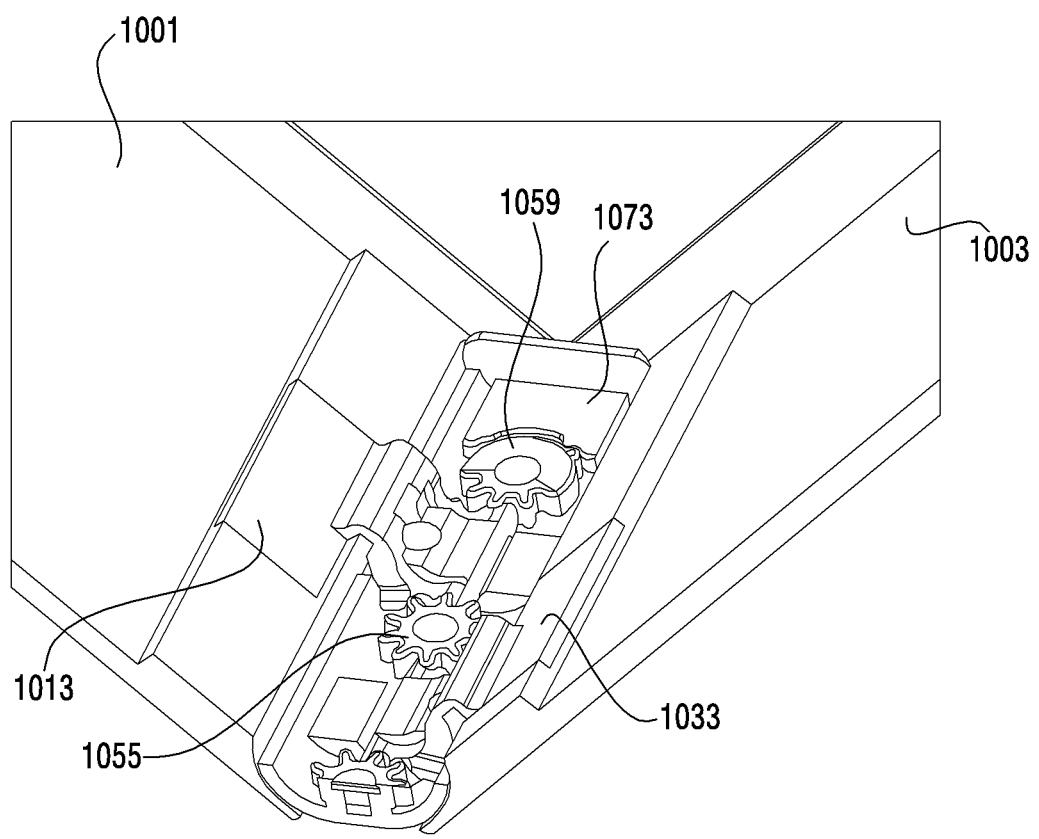
FIG. 10B illustrates operations of hinge structures and gears according to an opening/closing operation of a foldable electronic device according to an embodiment.
Figure 10C:
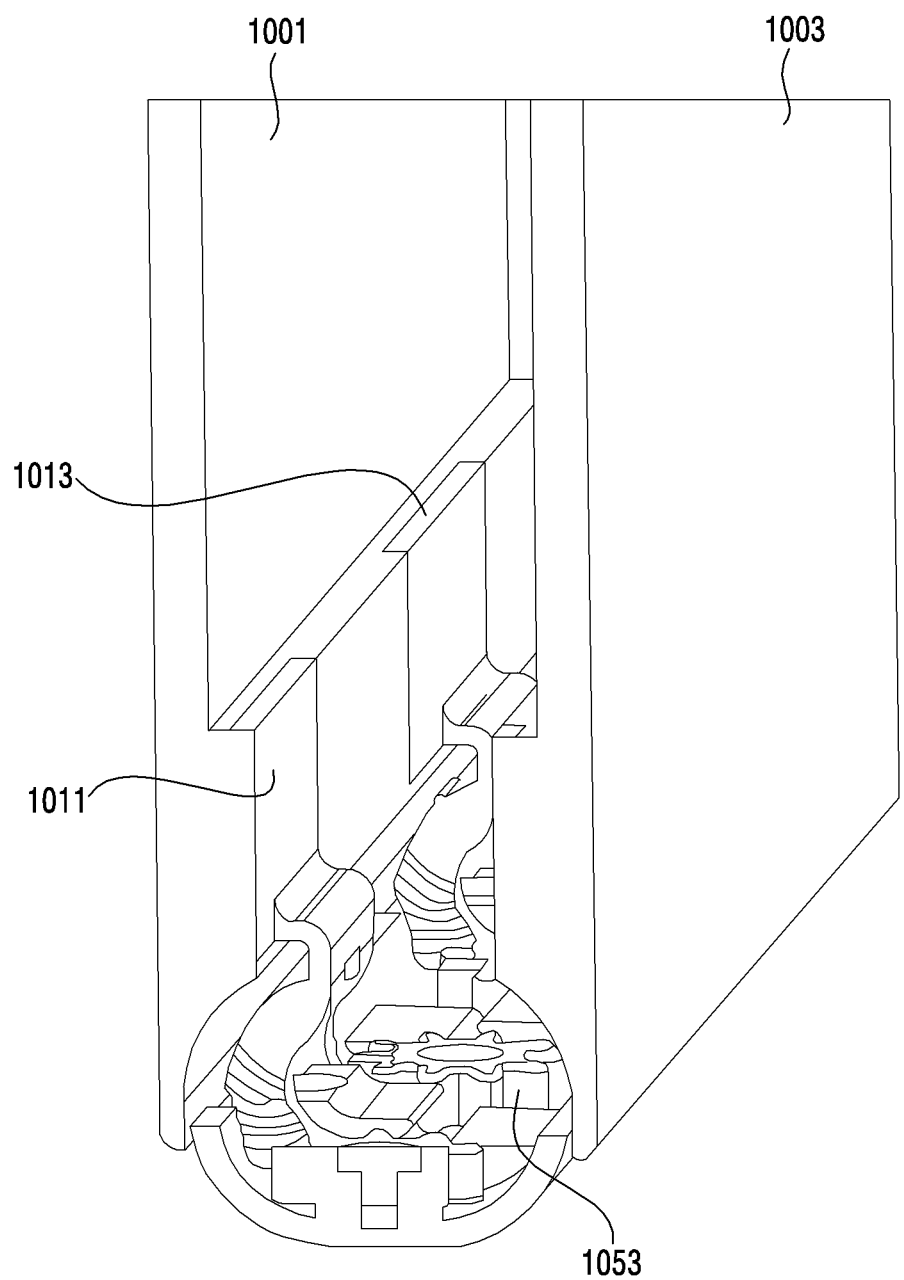
FIG. 10C illustrates operations of hinge structures and gears according to an opening/closing operation of a foldable electronic device according to an embodiment.

FIG. 10A illustrates operations of hinge structures and gears according to an opening/closing operation of a foldable electronic device according to an embodiment. FIG. 10B illustrates operations of hinge structures and gears according to an opening/closing operation of a foldable electronic device according to an embodiment. FIG. 10C illustrates operations of hinge structures and gears according to an opening/closing operation of a foldable electronic device according to an embodiment.

Referring to FIGS. 10A, 10B, and 10C, a foldable electronic device includes a plurality of hinge structures 1011, 1013, and 1033, gears 1053 and 1055, and gear 1059 connected to hinge structures 1013 and 1031 located at an outer side.

Each of the hinge structures 1011, 1013, and 1033 may have gears engaged with opposite sides thereof such that the hinge structures 1011, 1013, and 1033 operate organically with each other. For example, when a sliding part included in any of the hinge structures 1011, 1013, or 1033 fastened to a first part 1001 or the second part 1003 of the housing performs a sliding motion, the gears 1053 and 1055 connected to opposite sides of the sliding part are capable of rotating, and sliding parts included in the other hinge structures 1011, 1013, or 1033 connected to the gears 1053 and 1055 are capable of sliding.

The hinge structures 1011, 1013, and 1033 connected to opposite sides with respect to the gears 1053 and 1055 may slide in different directions. For example, when the sliding direction of the sliding parts included in the hinge structures 1011 and 1013 connected to the first part 1001 is the clockwise direction (or the counterclockwise direction) when the foldable electronic device is folded, the sliding direction of the sliding parts included in the hinge structure 1033 connected to the second part 1003 may be the counterclockwise direction (or the clockwise direction). However, when the sliding direction of the sliding parts included in the hinge structures 1011 and 1013 connected to the first part 1001 is the counterclockwise direction (or the clockwise direction) when the foldable electronic device is unfolded, the sliding direction of the sliding parts included in the hinge structure 1033 connected to the second part 1003 may be the clockwise direction (or the counterclockwise direction).

When the foldable electronic device is folded or unfolded, the gear 1059 disposed adjacent to the outer hinge structures 1013 and 1031 also rotates. The rotation of the gear 1059 may be limited by the rotation limiting portion 1073 arranged in a direction opposite the outer hinge structures 1013 and 1031 with respect to the gear 1059. For example, the protrusions formed on the gear 1059 may be engaged with the engagement portions formed on the rotation limiting portion 1073 while the gear 1059 is rotated. In this case, the first part 1001 and the second part 1003 may form an angle therebetween.

Figure 11A:
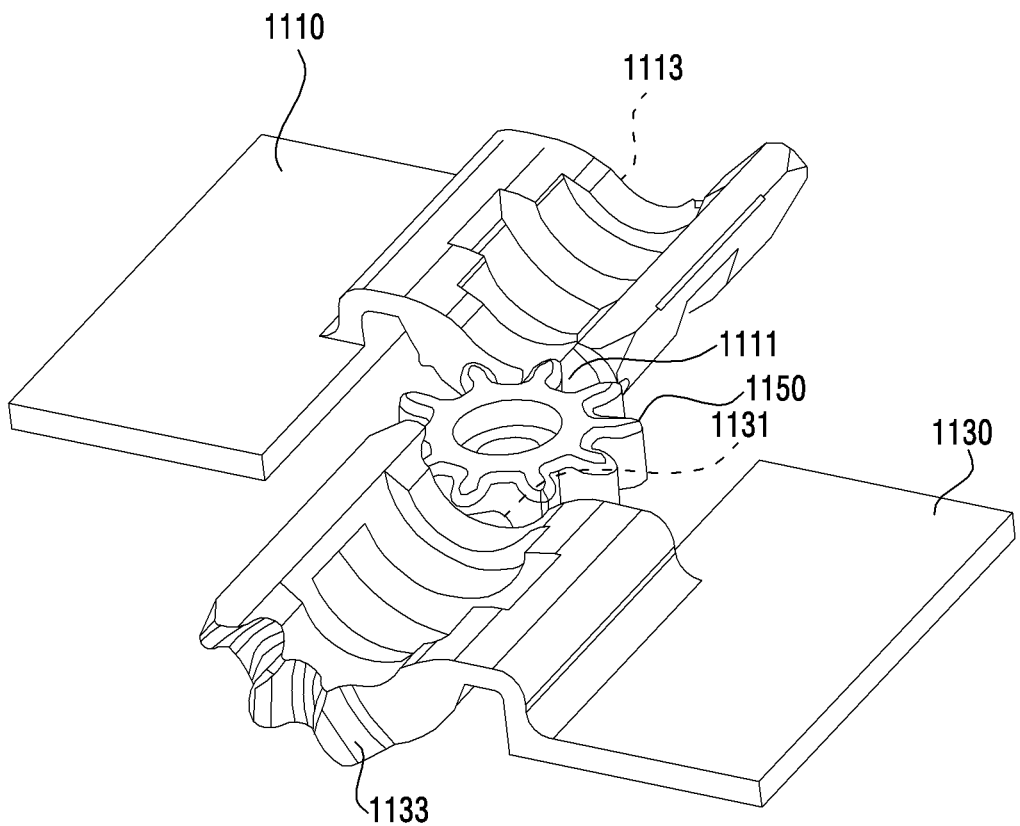
FIG. 11A illustrates an engagement structure of hinge structures and a gear in an unfolded foldable electronic device according to an embodiment.
Figure 11B:
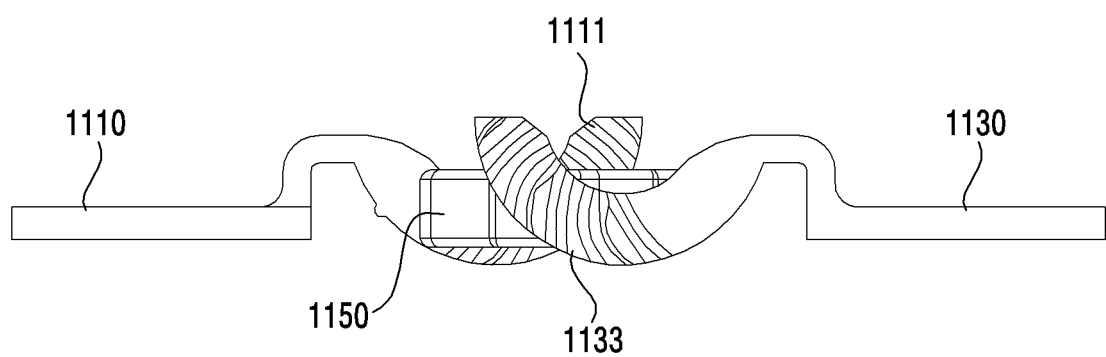
FIG. 11B illustrates an engagement structure of hinge structures and a gear in an unfolded foldable electronic device according to an embodiment.

FIG. 11A illustrates an engagement structure of hinge structures and a gear in a foldable electronic device that is unfolded according to an embodiment. FIG. 11B illustrates an engagement structure of hinge structures and a gear in a foldable electronic device that is unfolded according to an embodiment.

Figure 12A:
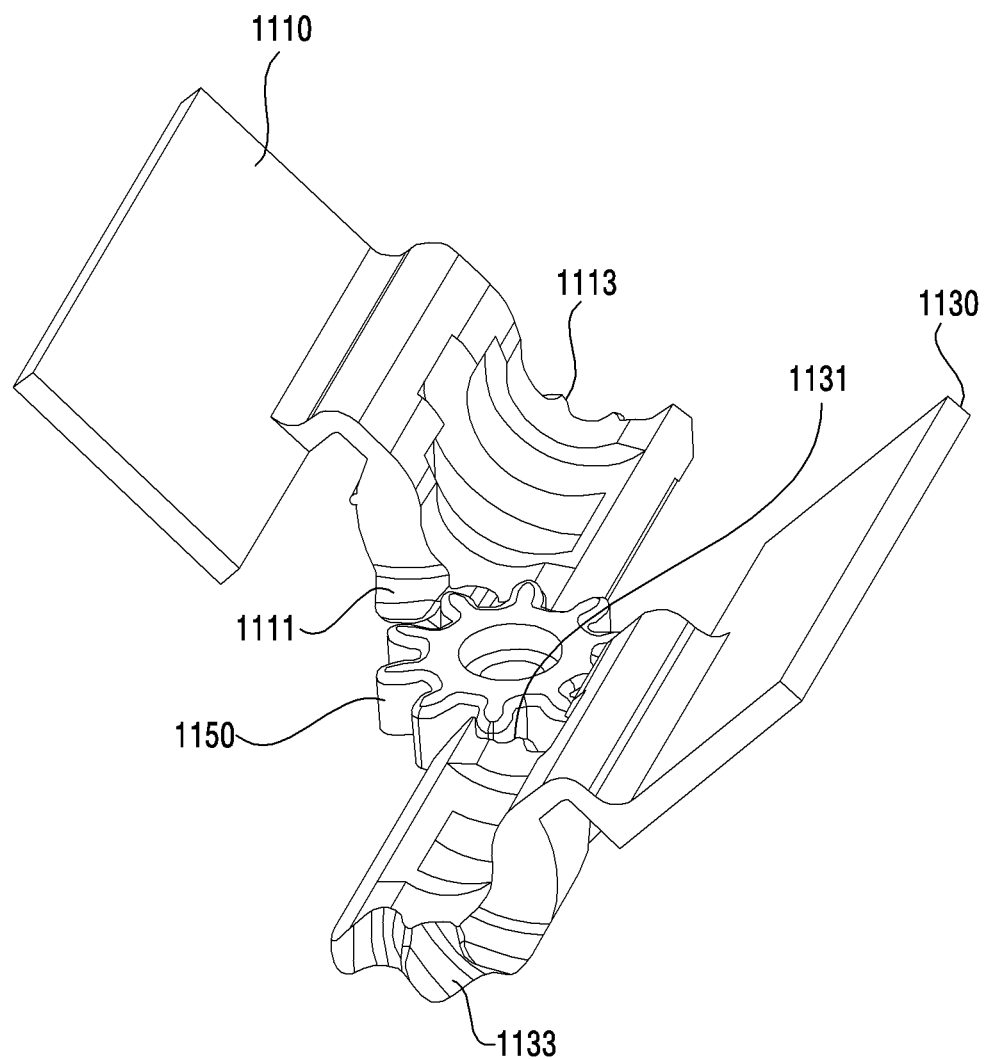
FIG. 12A illustrates an engagement structure of hinge structures and a gear in a foldable electronic device that is unfolded by a predetermined angle according to an embodiment.
Figure 12B:
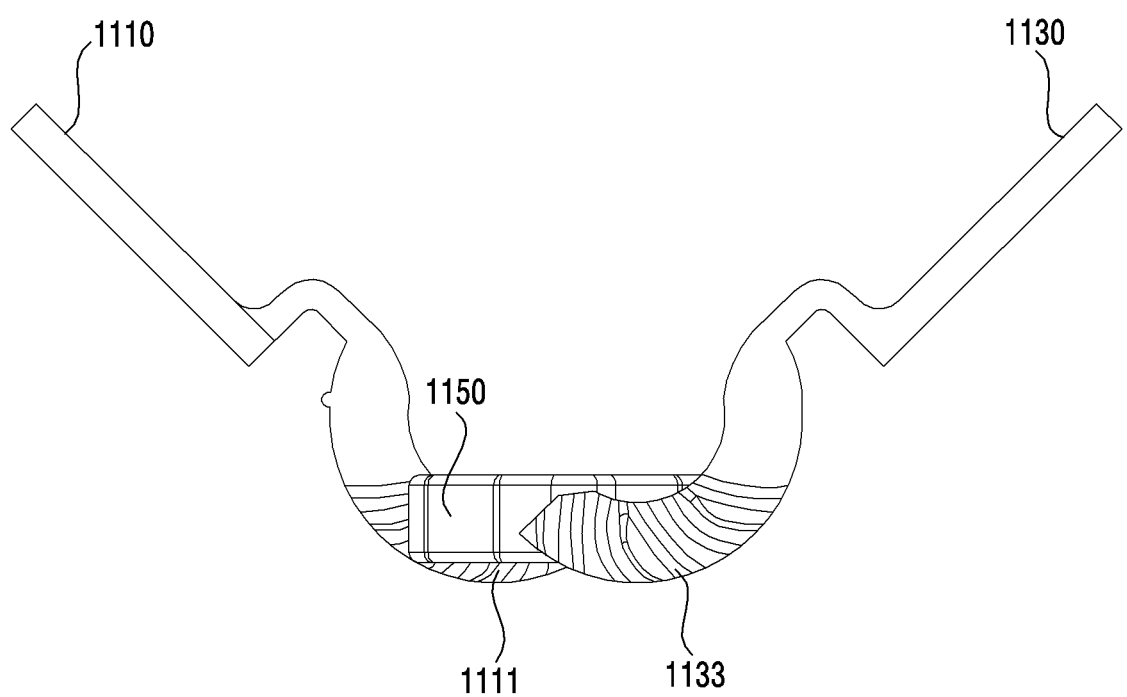
FIG. 12B illustrates an engagement structure of hinge structures and a gear in a foldable electronic device that is unfolded by a predetermined angle according to the embodiment.

FIG. 12A illustrates an engagement structure of hinge structures and a gear in a foldable electronic device that is unfolded by a predetermined angle according to an embodiment. FIG. 12B illustrates an engagement structure of hinge structures and a gear in a foldable electronic device that is unfolded by a predetermined angle according to an embodiment.

Figure 13A:
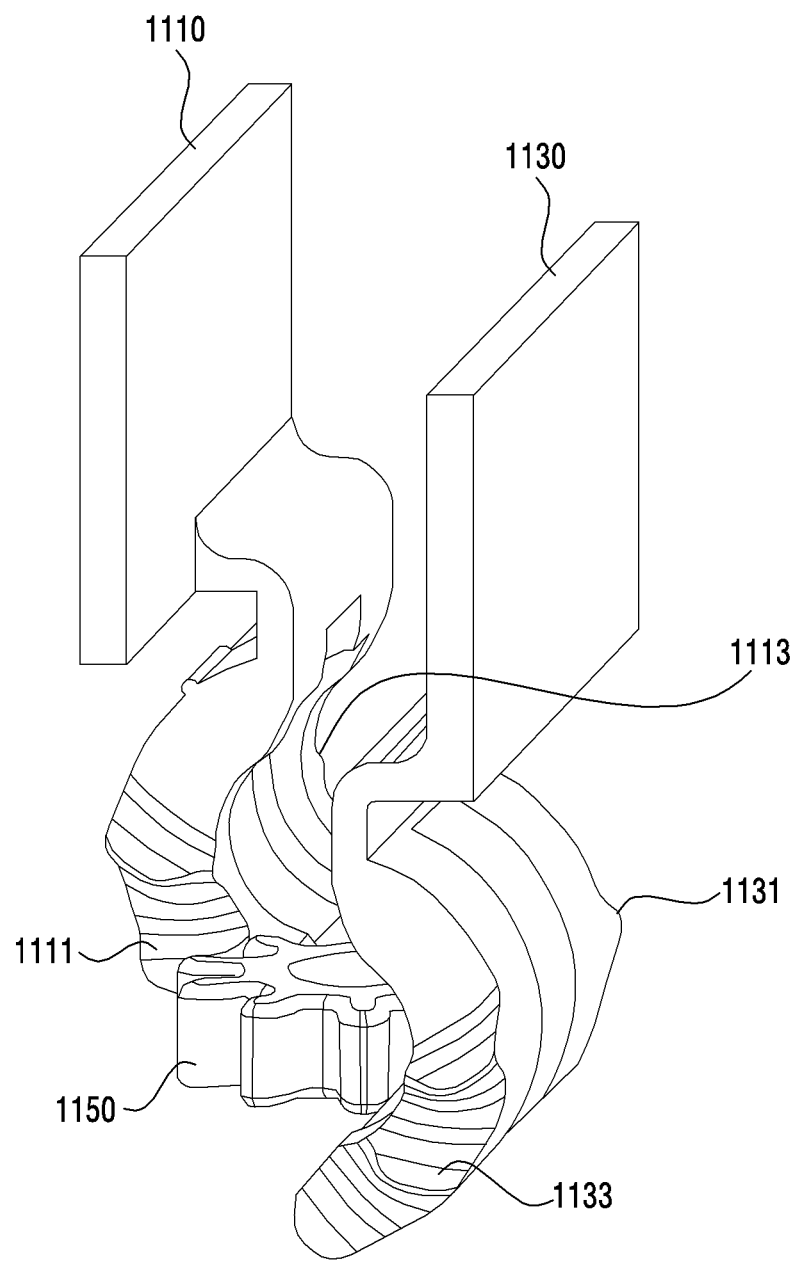
FIG. 13A illustrates an engagement structure of hinge structures and a gear in a foldable electronic device that is folded according to an embodiment.
Figure 13B:
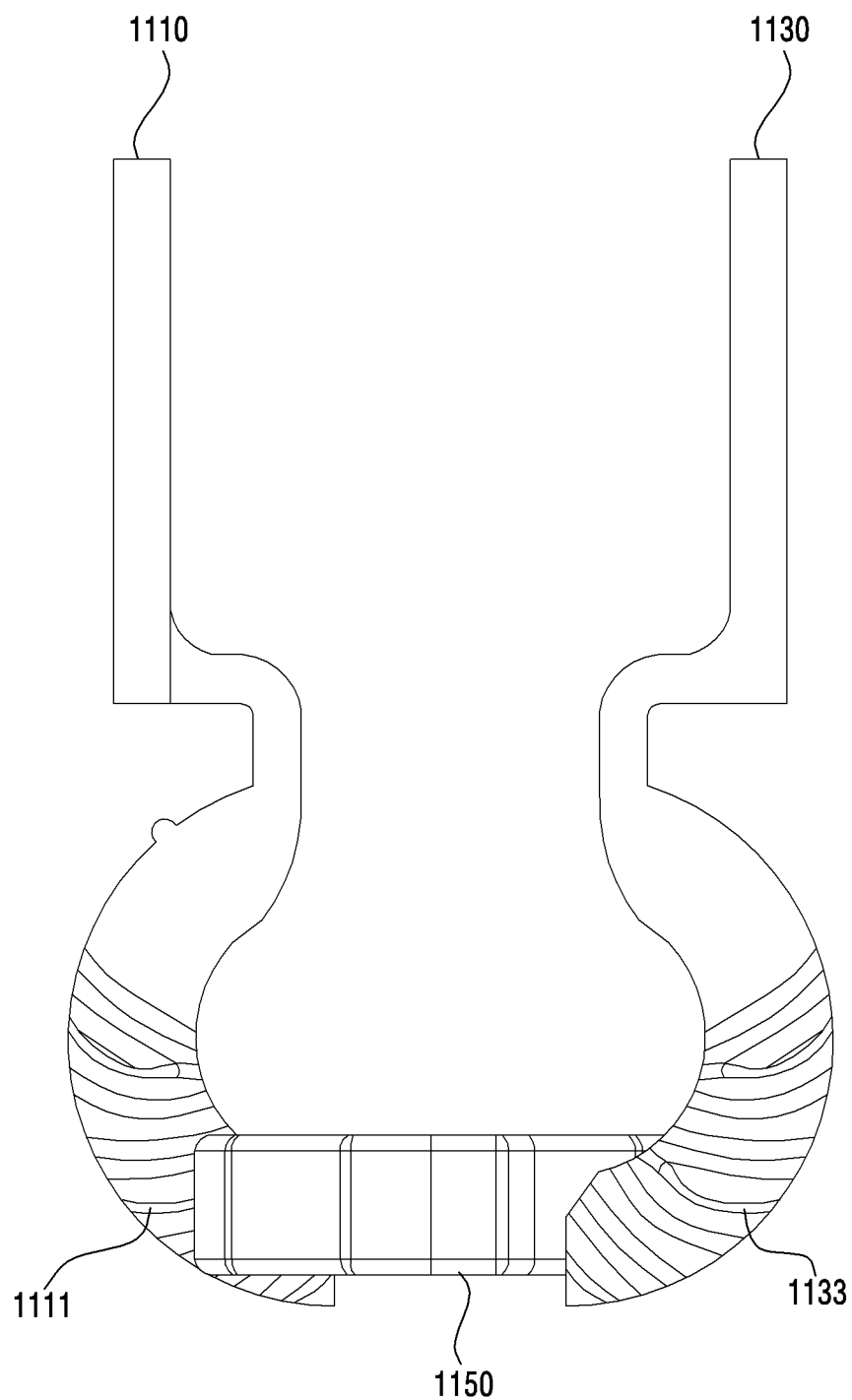
FIG. 13B illustrates an engagement structure of hinge structures and a gear in a foldable electronic device that is folded according to the embodiment.

FIG. 13A illustrates an engagement structure of hinge structures and a gear in a foldable electronic device that is folded according to an embodiment, and FIG. 13B illustrates is a view for describing an engagement structure of hinge structures and a gear in a foldable electronic device that is folded according to an embodiment.

Referring to FIGS. 11A, 11B, 12A, 12B, 13,A, and 13B, hinge structures 1110 and 1130 disposed adjacent to each other are gear-coupled to each other by a gear 1150. The gear teeth of the gear 1150 may be engaged with the gear portions 1111, 1113, 1131, and 1133 of the hinge structures 1110 and 1130 disposed on opposite sides of the gear 1150 so that the gear 1150 and the hinge structures 1110 and 1130 rotate simultaneously.

The gear portions 1111, 1113, 1131, and 1133 may be disposed on side surfaces of sliding parts included in the hinge structures 1110 and 1130. For example, a first sliding part included in the first hinge structure 1110 may include the first gear portion 1111 formed on one side surface in the direction in which the gear 1150 is disposed and the second gear portion 1113 formed on the other side surface. A second sliding part included in the second hinge structure 1130 may include the third gear portion 1131 formed on one side surface in the direction in which the gear 1150 is disposed and the fourth gear portion 1133 formed on the other side surface. The gear portions 1111, 1113, 1131, and 1133 may include gear teeth. The gear portions 1111, 1113, 1131, and 1133 may include a plurality of gear teeth formed from the first ends to the second ends of the side surfaces of the sliding parts. The plurality of gear teeth may be sequentially formed in the direction from one end of a side surface located away from a connection part extending from the sliding part toward the position where the connection part is disposed.

In the following description, a gear tooth closest to the connection part will be referred to as a first gear tooth, and a gear tooth farthest from the connection part will be referred to as a second gear tooth.

The first sliding part in the first hinge structure 1110 and the second sliding part the second hinge structure 1130, which are respectively disposed on opposite sides of the gear 1150, may perform sliding motions in different directions by the rotation of the gear 1150. When the gear 1150 rotates, the first sliding part may slide clockwise (or counterclockwise) about a first axis, and the second sliding part may slide counterclockwise (or clockwise) about a second axis. Accordingly, a first part of a housing connected to the first hinge structure 1110 and a second part of the housing connected to the second hinge structure 1130 may rotate to face each other as the foldable electronic device is folded, or the first part and the second part may rotate away from each other as the foldable electronic device is unfolded.

As illustrated in FIGS. 11A and 11B, wherein the engagement structure of the first hinge structure 1110, the second hinge structure 1130, and the gear 1150 in the fully unfolded state, the first gear portion 1111 formed on the side surface of the first sliding part, the third gear portion 1131 formed on the side surface of the second sliding part, and the gear 1150 are engaged with each other when the foldable electronic device is fully unfolded. When the foldable electronic device is fully unfolded, the first gear tooth of the first gear portion 1111 may be engaged with the gear teeth of the gear 1150, and the first gear tooth of the third gear part 1131 may be engaged with the gear teeth of the gear 1150.

When the foldable electronic device starts to be folded from the fully unfolded state, the first sliding part and the second sliding part may perform a sliding motion together with the rotation of the gear 1150. At this time, the gear teeth of the first gear portion 1111 to be engaged with the gear teeth of the gear 1150 may be changed in the direction of the sliding motion of the first sliding part, and the gear teeth of the third gear portion 1131 to be engaged with the gear teeth of the gear 1150 in the direction of the sliding motion of the second sliding part may also be changed. For example, for the gear teeth included in the first gear portion 1111, the gear teeth arranged in the direction of the sliding motion of the first sliding part may be sequentially engaged with the gear teeth of the gear 1150 starting from the first gear tooth, and for the gear teeth included in the third gear portion 1131, the gear teeth arranged in the direction of the sliding motion of the second sliding part may also be sequentially engaged with the gear teeth of the gear 1150 starting from the first gear tooth.

As illustrated in FIGS. 12A to 12B, when the foldable electronic device is unfolded by a specific angle, among the gear teeth included in the first gear portion 1111, any one gear tooth located between the first gear tooth and the second gear tooth may be engaged with the gear teeth of the gear 1150, and among the gear teeth included in the third gear portion 1131, any one gear tooth located between the first gear tooth and the second gear tooth may be engaged with the gear teeth of the gear 1150.

As illustrated in FIGS. 13A and 13B, when the foldable electronic device is fully folded, among the gear teeth included in the first gear portion 1111, the second gear tooth may be engaged with the gear teeth of the gear 1150, and among the gear teeth included in the third gear portion 1131, the second gear tooth may be engaged with the gear teeth of the gear 1150.

Even when the foldable electronic device is unfolded from the fully folded state (the state of FIGS. 13A and 13B), the same operation may be performed. When the foldable electronic device starts to be unfolded from the fully folded state, the gear teeth of the first gear portion 1111 to be engaged with the gear teeth of the gear 1150 may be changed in the direction of the sliding motion of the first sliding part, and the gear teeth of the third gear portion 1131 to be engaged with the gear teeth of the gear 1150 in the direction of the sliding motion of the second sliding part may also be changed. For the gear teeth included in the first gear portion 1111, the gear teeth arranged in the direction of the sliding motion of the first sliding part may be sequentially engaged with the gear teeth of the gear 1150 starting from the second gear tooth, and for the gear teeth included in the third gear portion 1131, the gear teeth arranged in the direction of the sliding motion of the second sliding part may also be sequentially engaged with the gear teeth of the gear 1150 starting from the second gear tooth.

Figure 14A:
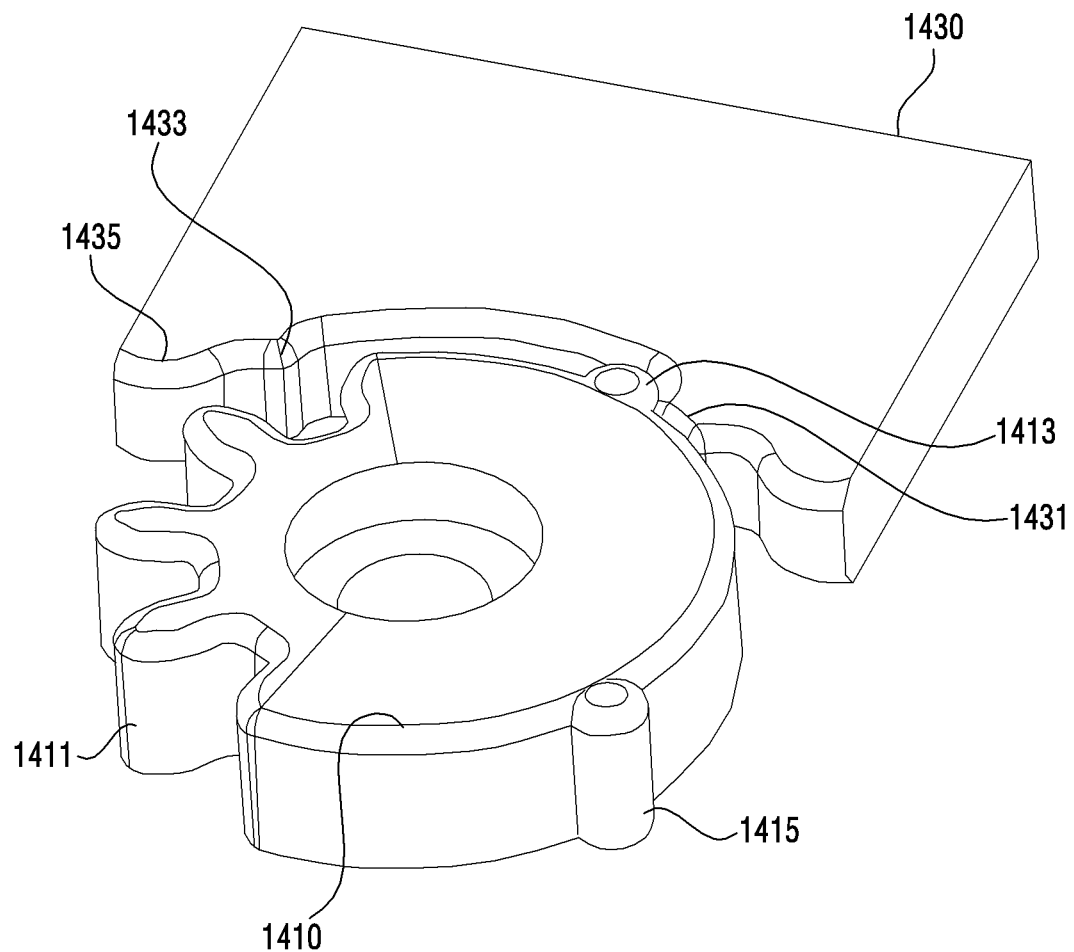
FIG. 14A illustrates an engagement structure of a gear and a rotation limiting portion according to an opening/closing operation of a foldable electronic device according to an embodiment.
Figure 14B:
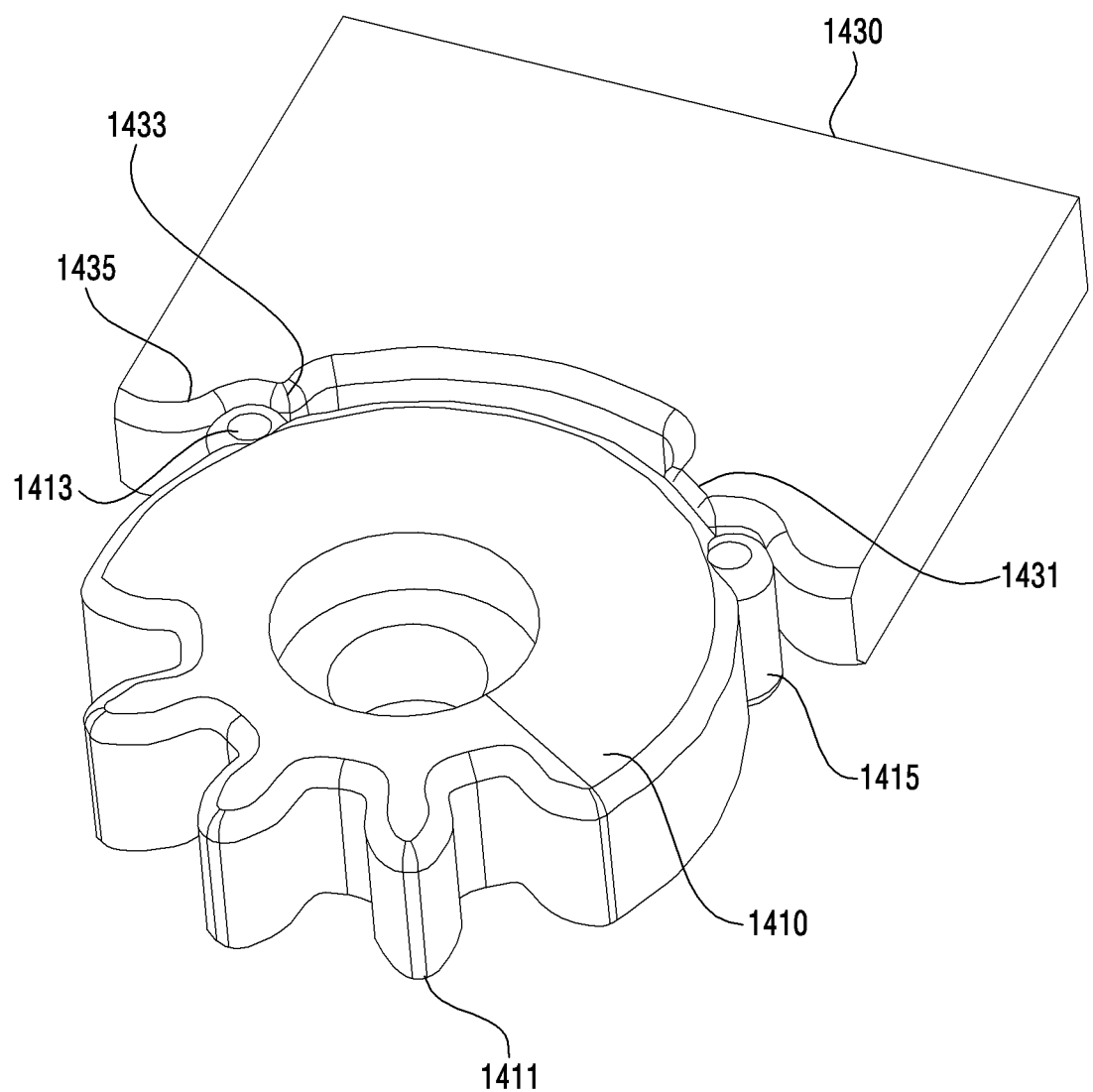
FIG. 14B illustrates an engagement structure of a gear and a rotation limiting portion according to an opening/closing operation of a foldable electronic device according to an embodiment.
Figure 14C:
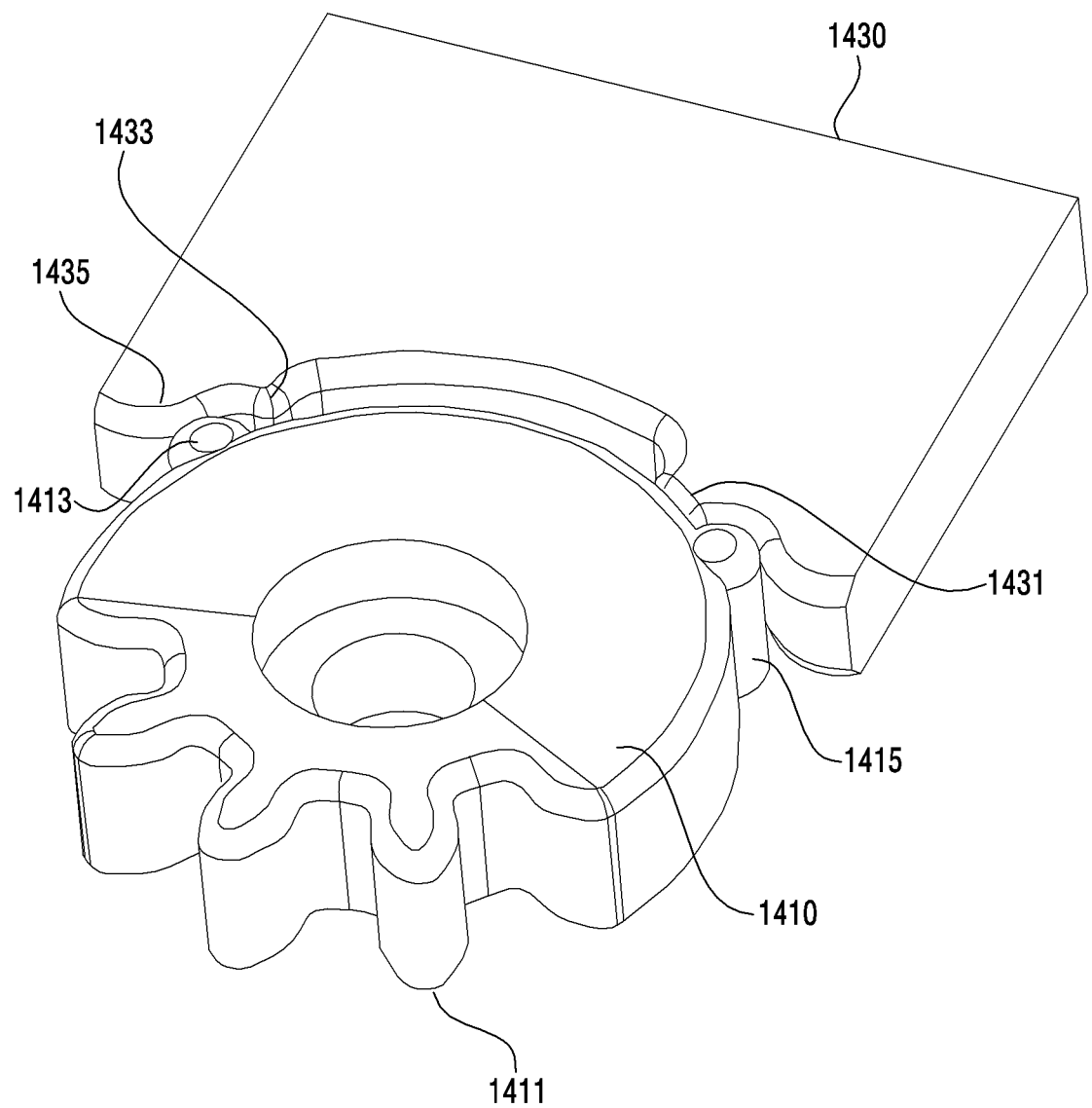
FIG. 14C illustrates an engagement structure of a gear and a rotation limiting portion according to an opening/closing operation of a foldable electronic device according to an embodiment.

FIG. 14A illustrates an engagement structure of a gear and a rotation limiting portion according to an opening/closing operation of a foldable electronic device according to an embodiment. FIG. 14B illustrates an engagement structure of a gear and a rotation limiting portion according to an opening/closing operation of a foldable electronic device according to an embodiment. FIG. 14C illustrates an engagement structure of a gear and a rotation limiting portion according to an opening/closing operation of a foldable electronic device according to an embodiment.

Referring to FIGS. 14A to 14C, a foldable electronic device includes a rotation limiting portion, which is disposed, with reference to a gear 1410 that is disposed adjacent to outer hinge structures among a plurality of hinge structures, at a side opposite the outer hinge structures.

The rotation limiting portion 1430 may limit the rotation of the gear 1410 disposed adjacent thereto. For example, when the rotation angle of the gear 1410 is within a first angular range, the rotation limiting portion 1430 allows the gear 1410 to rotate by an external force greater than or equal to a first magnitude, and when the rotation angle is within a second angular range, the rotation limiting portion 1430 allows the gear 1410 to rotate by an external force greater than or equal to a second magnitude. The second magnitude is larger than the first magnitude. Accordingly, the rotation limiting portion 1430 may maintain the open state of the foldable electronic device in the second angular range unless an external force greater than or equal to the second magnitude is applied.

The gear 1410 includes gear teeth 1411 formed in a first portion thereof engaged with the gear portion of the sliding part connected to the gear 1410, and protrusions 1413 and 1415 formed in a second portion thereof facing the rotation limiting portion 1430. The protrusions 1413 and 1415 may limit an angular range (e.g., 0 degrees to 180 degrees) in which the gear 1410 is rotatable. The gear 1410 may have a first protrusion 1413 and a second protrusion 1415 at respective positions corresponding to the boundary angles of the angular range in the second portion.

The rotation limiting portion 1430 includes engagement portions 1431, 1433, and 1435 protruding on the surface facing the gear 1410. The engagement portions 1431, 1433, and 1435 may protrude such that the protrusions 1414 and 1415 formed on the gear 1410 are engaged therewith while the gear 1410 is rotated as the foldable electronic device is folded or unfolded. The engagement portions 1431, 1433, and 1435 may limit the angular range in which the gear 1410 is rotatable, and when the foldable electronic device is unfolded by a predetermined angle, the engagement portions 1431, 1433, and 1435 may limit the rotation of the gear 1410 such that the gear 1410 does not rotate unless an external force exceeding a predetermined magnitude is applied thereto. The rotation limiting portion 1430 includes a first engagement portion 1431 and a second engagement portion 1435 at respective positions corresponding to the boundary angles of the angular range. In addition, the rotation limiting portion 1430 may have a third engagement portion 1433 at a position corresponding to a predetermined angle within the angular range.

More specifically, FIGS. 14A, 14B, and 14C illustrate engagement structures of the gear 1410 and the rotation limiting portion 1430 when the foldable electronic device is fully folded, when the foldable electronic device is unfolded by a predetermined angle, and when the foldable electronic device is fully unfolded, respectively.

When the foldable electronic device is fully folded, as illustrated in FIG. 14A, the first protrusion 1413 of the gear 1410 may be engaged with the first engagement portion 1431 of the rotation limiting portion 1430. Accordingly, the gear 1410 may no longer rotate in the direction in which the first protrusion 1413 passes through the first engagement portion 1431.

Even when the foldable electronic device is fully unfolded, as illustrated in FIG. 14C, the first protrusion 1413 of the gear 1410 may be engaged with the second engagement portion 1435 of the rotation limiting portion 1430, and the second protrusion 1415 of the gear 1410 may be engaged with the first engagement portion 1431 of the rotation limiting portion 1430. Accordingly, the gear 1410 may no longer rotate in the direction in which the second protrusion 1415 passes through the first engagement portion 1431 (in the direction in which the first protrusion 1413 passes through the second engagement portion 1435).

When the foldable electronic device is unfolded from the fully folded state or when the foldable electronic device is folded from the fully unfolded state, with the rotation of the gear 1410, the first protrusion 1413 of the gear 1410 may move along the facing surface of the rotation limiting portion 1430. In this case, the gear 1410 may be rotated by an external force greater than or equal to a first magnitude.

As illustrated in FIG. 14B, the first protrusion 1413 may be engaged with the third engagement portion 1433 while moving between the first engagement portion 1431 and the second engagement portion 1435. When the first protrusion 1413 is engaged with the third engagement portion 1433, the foldable electronic device may unfolded by a predetermined angle (e.g., about 172 degrees). When the first protrusion 1413 is engaged with the third engagement portion 1433, in order to allow the first protrusion 1413 to pass over the third engagement portion 1433, an external force greater than or equal to a second magnitude, which is greater than the first magnitude, may be needed. That is, the gear 1410 is rotatable in the direction in which the first protrusion 1413 passes through the third engagement portion 1433 only when an external force greater than or equal to the second magnitude is applied thereto. Accordingly, the foldable electronic device may maintain being unfolded by the predetermined angle unless an external force greater than or equal to the second magnitude is applied to the gear 141.

Figure 15A:
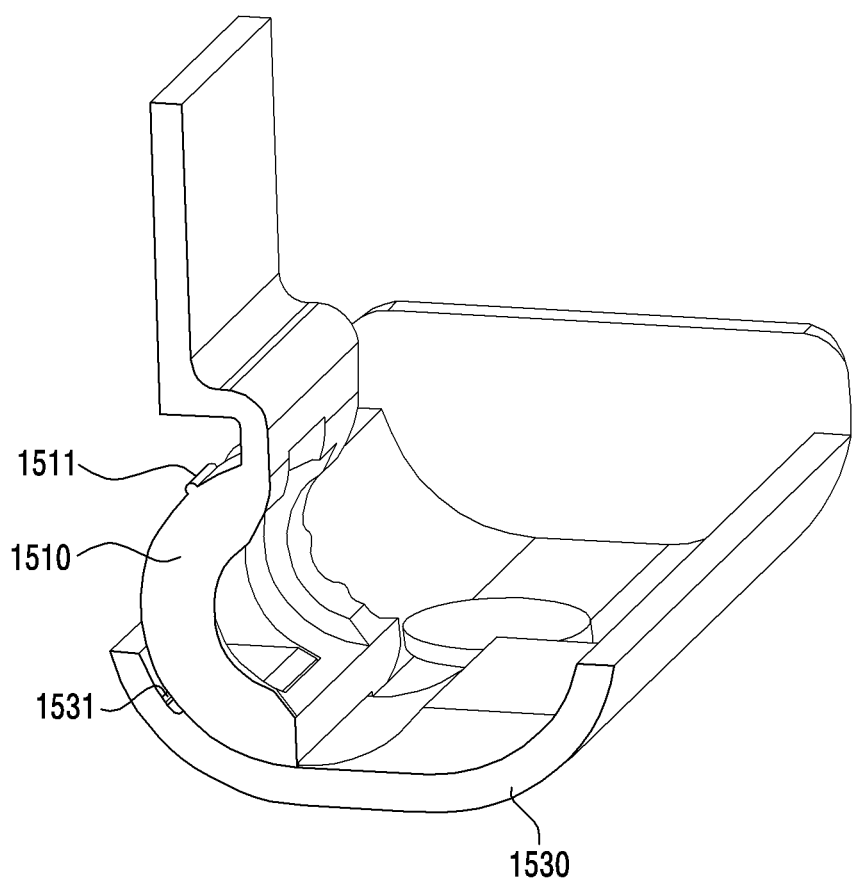
FIG. 15A illustrates a sliding structure of a hinge structure according to an opening/closing operation of a foldable electronic device according to an embodiment.
Figure 15B:
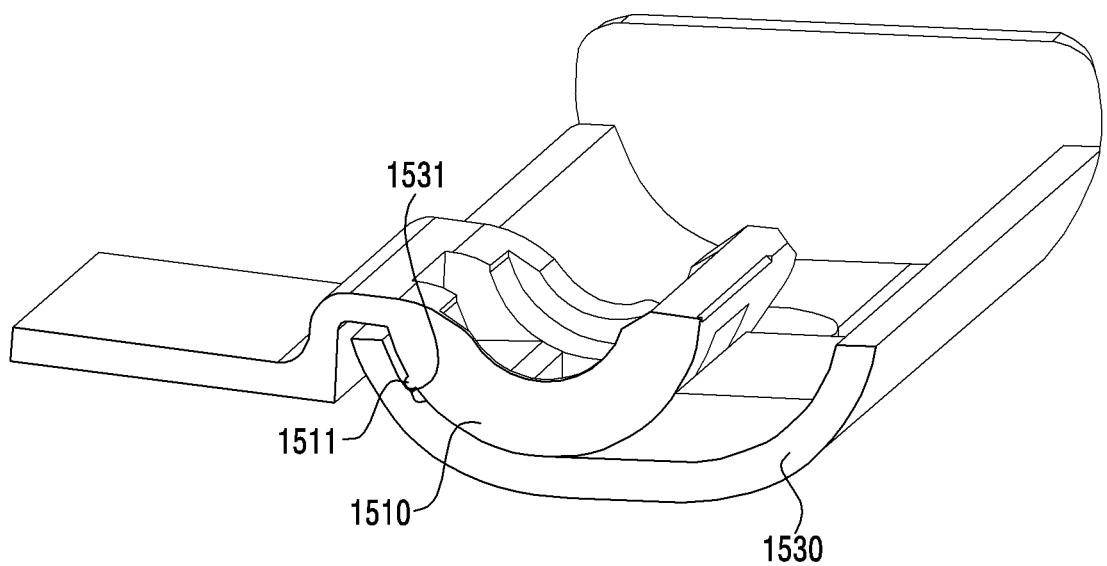
FIG. 15B illustrates a sliding structure of a hinge structure according to an opening/closing operation of a foldable electronic device according to an embodiment.
Figure 15C:
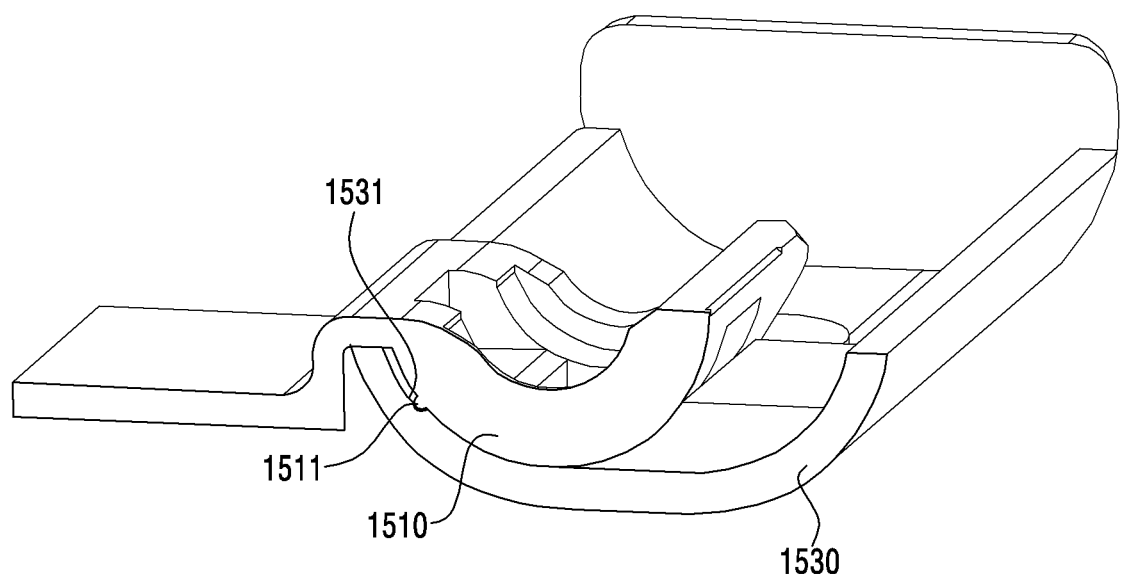
FIG. 15C illustrates a sliding structure of a hinge structure according to an opening/closing operation of a foldable electronic device according to an embodiment.

FIG. 15A illustrates a sliding structure of a hinge structure according to an opening/closing operation of a foldable electronic device according to an embodiment. FIG. 15B illustrates a sliding structure of a hinge structure according to an opening/closing operation of a foldable electronic device according to an embodiment. FIG. 15C illustrates a sliding structure of a hinge structure according to an opening/closing operation of a foldable electronic device according to an embodiment.

Referring to FIGS. 15A, 15B, and 15C, a hinge structure includes a sliding part 1510 and a hinge housing 1530. The sliding part 1510 may perform a sliding motion along the surface facing the hinge housing 1530 between the hinge housing 1530 and the guide member.

The sliding part 1510 includes a first protrusion 1511 on the surface facing the gear 1530. The first protrusion 1511 may extend in the width direction of the sliding part 1510.

The hinge housing 1530 includes a second protrusion 1531 on the surface facing the sliding part 1510. The second protrusion 1531 may have a length corresponding to the length of the first protrusion 1511.

When the foldable electronic device is folded from an unfolded state (the state illustrated in FIG. 15C) or is unfolded from a folded state (the state illustrated in FIG. 15A), the sliding part 1510 slides along the surface facing the hinge housing 1530, and the first protrusion 1511 of the sliding part 1510 may be engaged with the second protrusion 1531 of the hinge housing 1530, as illustrated in FIG. 15B.

When the first protrusion 1511 is engaged with the second protrusion 1531, the foldable electronic device may be unfolded by a predetermined angle (e.g., about 172 degrees). In order for the first protrusion 1511 to pass over the second protrusion 1531, an external force greater than or equal to a predetermined magnitude may be required. That is, the first protrusion 1510 is slidable in the direction in which the first protrusion 1511 passes through the second protrusion 1531 only when an external force greater than or equal to the predetermined magnitude is applied thereto. Accordingly, when the first protrusion 1511 is engaged with the second protrusion 1531, the foldable electronic device may maintain being unfolded by a predetermined angle unless an external force greater than or equal to the predetermined magnitude is applied to the sliding part 1510.

Alternatively, either the first protrusion 1511 or the second protrusion 1531 may be replaced with a groove capable of accommodating the other protrusion. The foldable electronic device may maintain being unfolded by the predetermined angle by the engagement structure of the sliding part 1510 and the guide member. For example, the sliding part 1510 may include a protrusion on the surface facing the guide member, and the guide member may include a groove in the surface facing the sliding part 1510. Accordingly, when the foldable electronic device is folded from the unfolded state or is unfolded from the folded state, the sliding part 1510 slides along the surface of the guide member facing the sliding part and the protrusion of the sliding part 1510 may be inserted into the groove in the guide member. In this case, when the protrusion on the sliding part 1510 is inserted in the groove in the guide member, the foldable electronic device may maintain being unfolded by the predetermined angle unless an external force greater than or equal to the predetermined magnitude is applied to the sliding part 1510.

According to an embodiment, a foldable electronic may include a housing including a first part and a second part; a flexible display seated on the first part and the second part; and a hinge structure configured to allow a first region of the flexible display seated on the first part or a second region of the flexible display seated on the second part to pivot such that the flexible display is in a first state in which the first region and the second region are substantially flush with each other or in a second state in which the first region and the second region face each other. The hinge structure may include a hinge member including a sliding part and a connection part extending from the sliding part and connected to the first part or the second part; a guide member; and a hinge housing covering the hinge member and the guide member. The guide member may be fastened to the hinge housing to be spaced apart from the hinge housing by a predetermined distance so as to form a space with the hinge housing, and the sliding part is inserted into the space and performs a sliding motion between the guide member and the hinge housing.

The sliding part and the guide member have surfaces that face each other, the surfaces including curved surfaces having substantially the same curvature, and the sliding part and the hinge housing have surfaces that face each other, the surfaces including curved surfaces having substantially the same curvature.

The sliding part may include an opening formed in a central portion thereof to extend in a direction of the sliding motion, the hinge housing may include a limiting portion protruding on the surface facing the sliding part and inserted into the opening, and when the first region and the second region of the flexible display are in the second state, a side wall formed by the opening may be engaged with the limiting portion so that a movement of the sliding part is limited.

The guide member may include a screw hole at a position eccentric to a central portion thereof toward the connection part, and a screw member may be inserted into the screw hole so as to fasten the guide member and the hinge housing to each other.

When the first region and the second region of the flexible display are in the first state, one end of the sliding part of the sliding part may be drawn out of the space so as to support the flexible display.

The foldable electronic device may further include a first support plate attached to the flexible display so as to at least partially overlap the first region between the first part and the first region; and a second support plate attached to the flexible display so as to at least partially overlap the second region between the second part and the second region.

The first support plate may include a first support portion protruding towards the first part and fastened to the first part, and may be spaced apart from the first part by a predetermined distance by the first support portion, and the second support plate may include a second support portion protruding towards the second part and fastened to the first part, and may be spaced apart from the second part by a predetermined distance by the second support portion.

The foldable electronic device may further include a PCB disposed in at least one of a space between the first support plate and the first part or a space between the second plate and the second part, and electrically connected to the flexible display.

The sliding part may include a first protrusion formed on a surface facing the hinge housing, the hinge housing may include a second protrusion formed on a surface facing the sliding part, and when the first region or the second region pivots, the first protrusion may be engaged with the second protrusion so that the first region and the second region form a predetermined angle therebetween.

The sliding part may include a first protrusion formed on a surface facing the guide member, the guide member may include a groove formed in a surface facing the sliding part, and when the first region or the second region pivots, the protrusion may be inserted into the groove so that the first region and the second region form a predetermined angle therebetween.

The hinge structure may include a first hinge structure configured to allow the first region to rotate about a first axis and a second hinge structure configured to allow the second region to rotate about a second axis. The first hinge structure may include a first connection part connected to the first part, and the second hinge structure may include a second connection part connected to the second part.

The first axis and the second axis may be spaced apart from each other by a predetermined distance.

When the first region and the second region of the flexible display are in the first state, one end of the first sliding part included in the first hinge structure may be drawn out of the space between the first guide member included in the first hinge structure and the hinge housing so as to support the second region, and when the first region and the second region of the flexible display are in the first state, one end of the second sliding part included in the second hinge structure may be drawn out of the space between the second guide member included in the second hinge structure and the hinge housing so as to support the first region.

The first guide member included in the first hinge structure may include a first recess portion, which is formed as the first guide member is recessed from a facing the first region toward a surface opposite the surface, from an end adjacent to the central portion of the hinge housing to a portion forming the first axis, and the second guide member included in the second hinge structure may include a second recess portion, which is formed as the second guide member is recessed from a surface facing the second region toward a surface opposite the surface, from an end adjacent to the central portion of the hinge housing to a portion forming the second axis.

The foldable electronic device may further include a gear disposed between the first hinge structure and the second hinge structure, the first sliding part included in the first hinge structure may include a first gear portion disposed on a side surface in a direction in which the gear is disposed, and engaged with the gear, the second sliding part included in the second hinge structure may include a second gear portion disposed on a side surface in the direction in which the gear is disposed, and engaged with the gear, and when the first sliding part slides in a first direction, the second sliding part may slide in a second direction different from the first direction.

The foldable electronic device may further include a gear disposed adjacent to the hinge structure, and the sliding part may include a gear portion disposed on a side surface in the direction in which the gear is disposed, and engaged with the gear.

The foldable electronic device may further include a rotation limiting portion disposed in a direction opposite a position where the sliding part is disposed with respect to the gear, wherein the rotation limiting portion may include an engagement portion protruding on a surface facing the gear, and when the first region or the second region pivots, the gear may be engaged with the engagement portion while being rotated, whereby the first region and the second region may form a predetermined angle therebetween.

The gear includes gear teeth formed in a first portion engaged with the gear portion of the sliding part and a protrusion protruding in a second portion facing the rotation limiting portion, and when the first region or the second region pivots, the protrusion may be engaged with the engagement portion.

The hinge structure may include a plurality of first hinge structures configured to allow the first region to pivot about a first axis and a plurality of second hinge structures configured to allow the second region to rotate about a second axis, the first hinge structures may include respective first connection parts connected to the first part, the second hinge structures may include respective second connection parts connected to the second part, and the first hinge structures and the second hinge structures may be alternately disposed.

The foldable electronic device may further include a plurality of first gears, each of which is disposed between adjacent first and second hinge structures among the first and second hinge structures and is engaged with the adjacent first and second hinge structures; two rotation limiting portions, which are disposed adjacent to two respective hinge structures located at an outer side among the first hinge structures and the second hinge structures; and two second gears, which are disposed between the two hinge structures and the two rotation limiting portions and are engaged with the hinge structures and the rotation limiting portions adjacent thereto, respectively.

Figure 16:
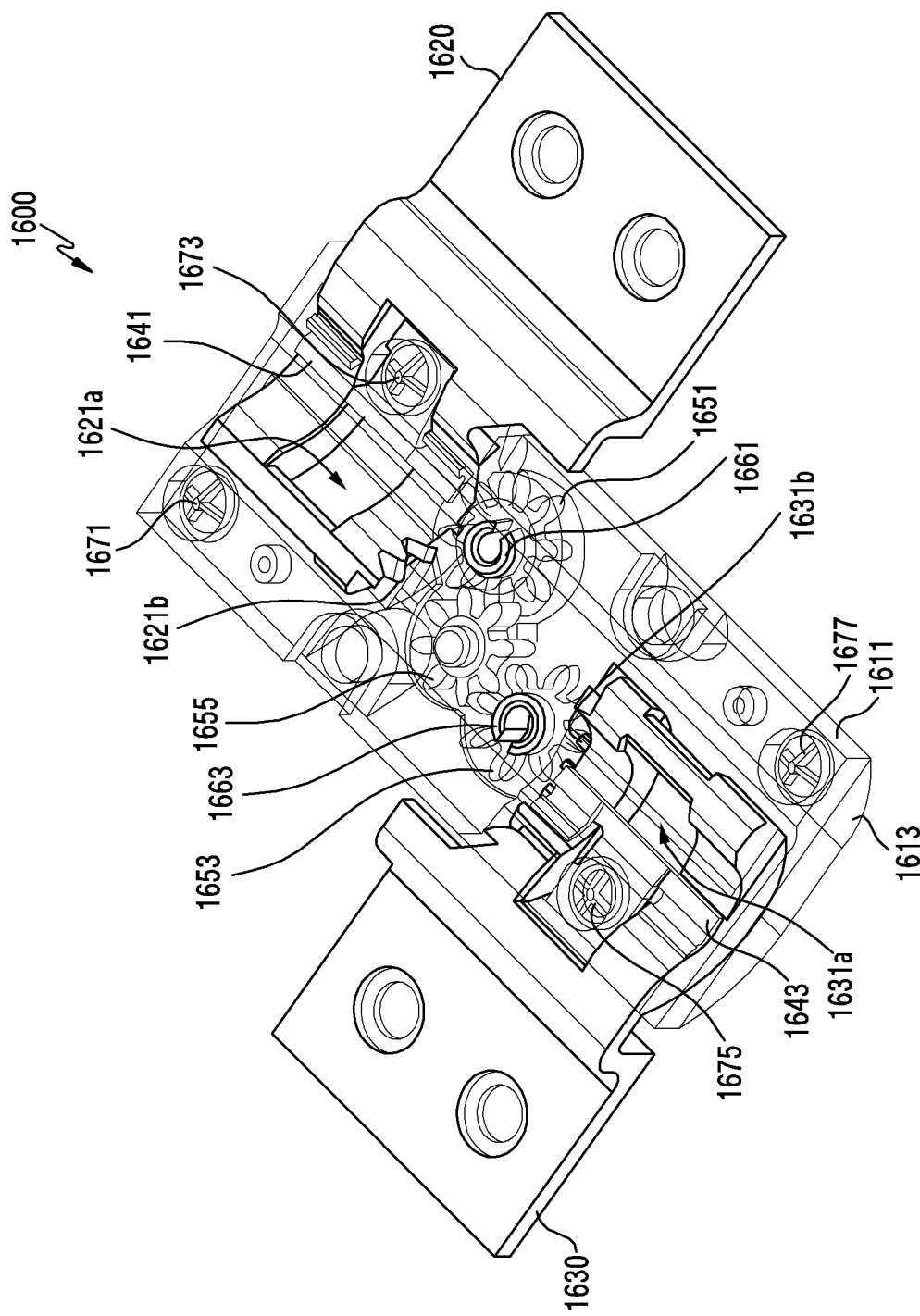
FIG. 16 illustrates a hinge module in an assembled state according to an embodiment.
Figure 17:
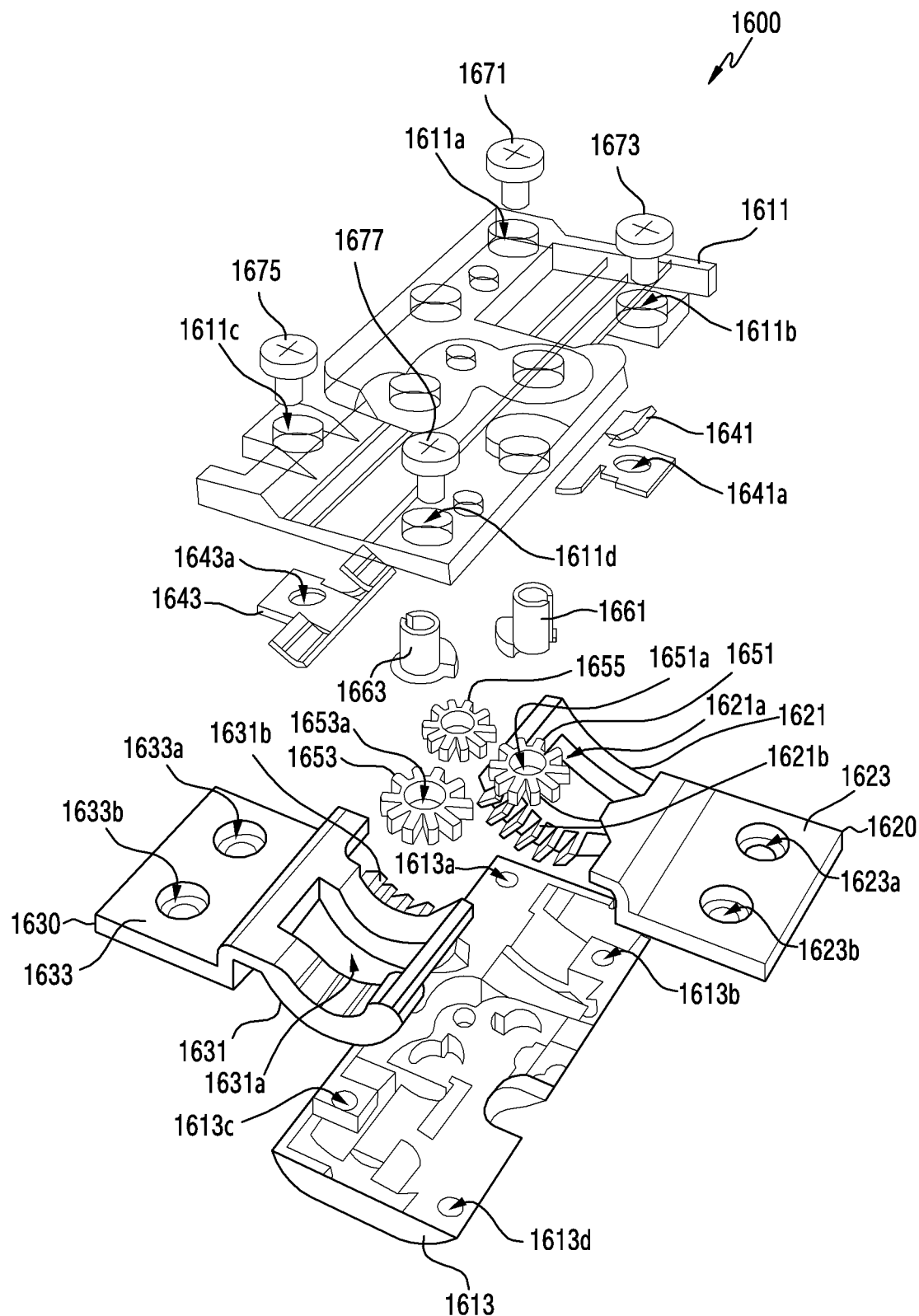
FIG. 17 illustrates a hinge module in a disassembled state according to an embodiment.
Figure 18:
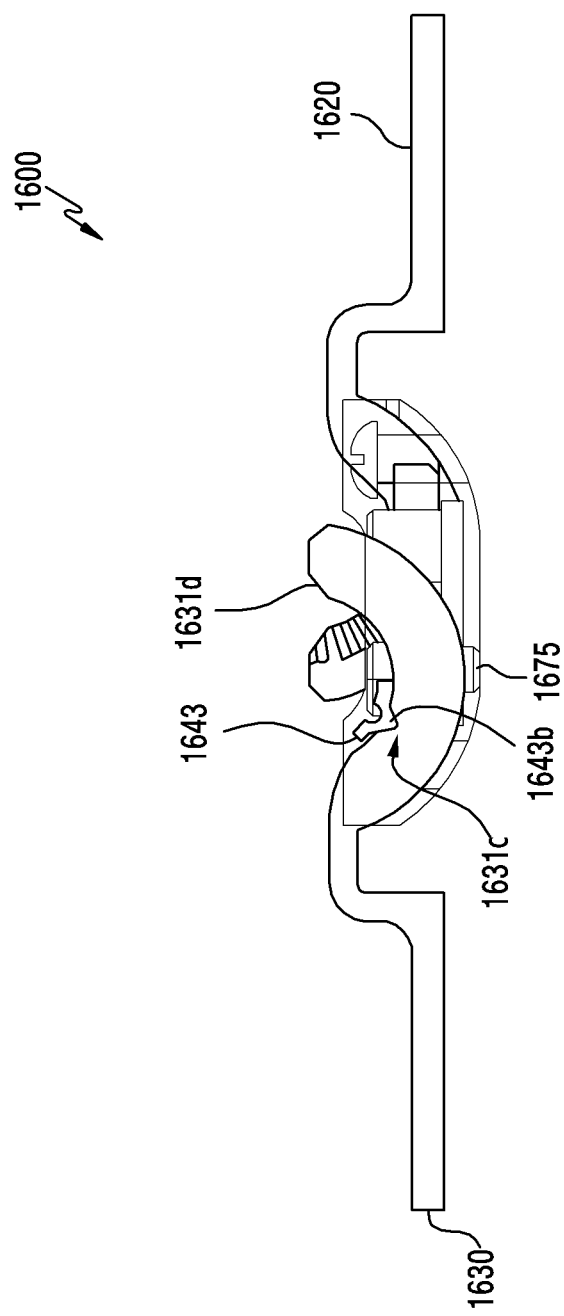
FIG. 18 illustrates a side view of a hinge module according to an embodiment.
Figure 19:
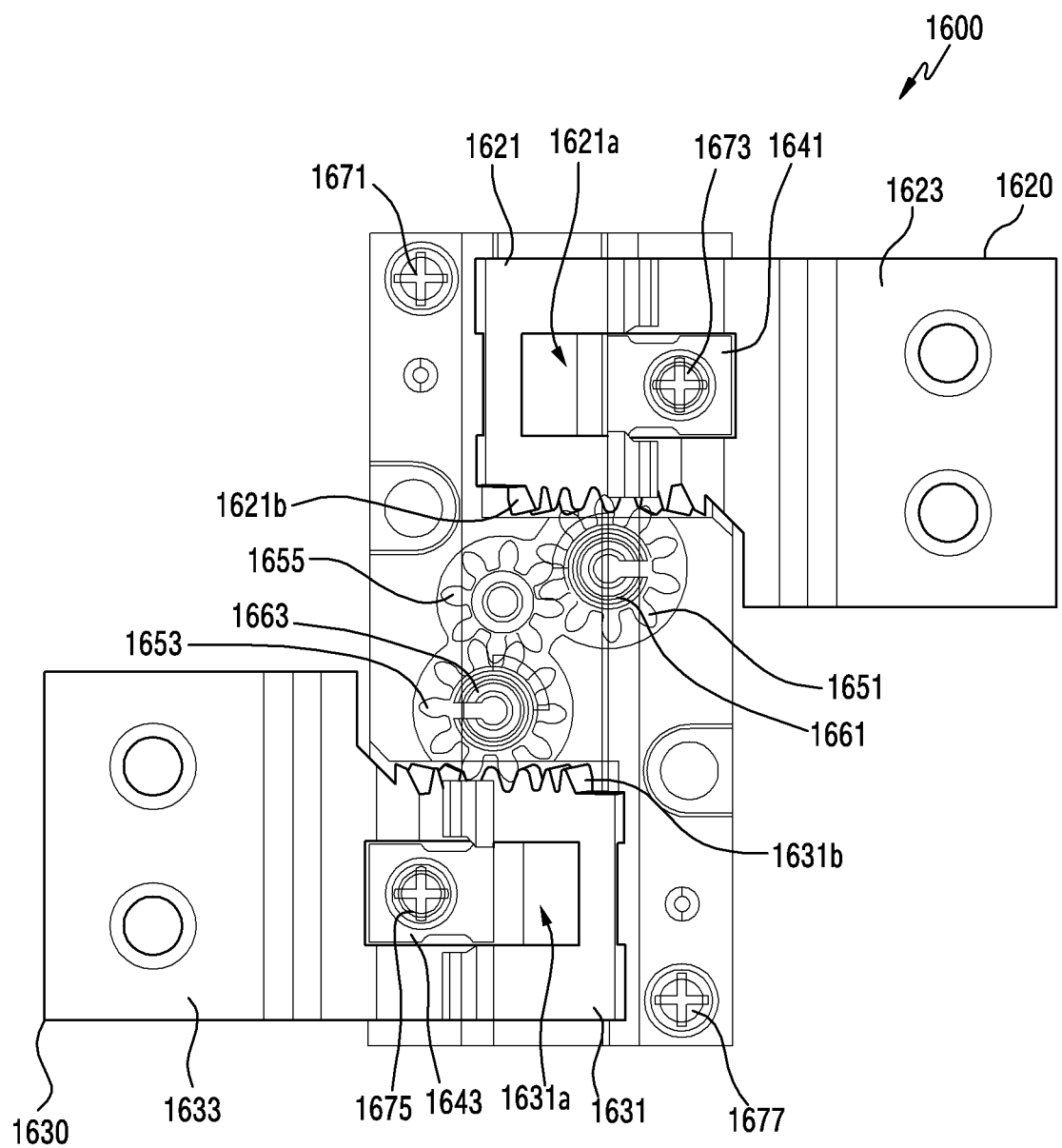
FIG. 19 illustrates a hinge module according to an embodiment.

FIG. 16 illustrates a hinge module in an assembled state according to an embodiment. FIG. 17 illustrates a hinge module in a disassembled state according to an embodiment. FIG. 18 illustrates a side view of a hinge module according to the embodiment. FIG. 19 illustrates a hinge module according to an embodiment.

Referring to FIGS. 16 to 19, a single hinge module 1600 is provided, in which a plurality of hinge members, a plurality of guide members, and at least one gear connected between the plurality of hinge members are arranged. The hinge module 1600 may be the minimum structure that allows the opening/closing operation of the foldable electronic device. For example, the foldable electronic device may include at least one hinge module 1600, and the number of hinge modules 1600 included in the foldable electronic device may increase in proportion to the size of the foldable electronic device.

The hinge module 1600 includes a plurality of hinge housings 1611 and 1613, a plurality of hinge members 1620 and 1630, a plurality of guide members 1641 and 1643, and a plurality of gears 1651, 1653, and 1655.

The housings 1611 and 1613 include an upper housing 1611 and a lower housing 1613. The upper housing 1611 and the lower housing 1613 may be coupled to each other with a predetermined space therebetween. At least some of the plurality of hinge members 1620 and 1630, the plurality of guide members 1641 and 1643, and the plurality of gears 1651, 1653 and 1655 may be disposed in the space.

The upper housing 1611 includes a plurality of screw holes 1611a, 1611b, 1611c, and 1611d. The lower housing 1613 includes screw accommodation grooves 1613a, 1613b, 1613c, and 1613d that accommodate screw members 1671, 1673, 1675, and 1677 inserted into the screw holes 1611a, 1611b, 1611c, and 1611d, when the lower housing 1613 is coupled to the upper housing 1611. More specifically, the upper housing 1611 includes a first screw hole 1611a, a second screw hole 1611b, a third screw hole 1611c, and a fourth screw hole 1611d, and the lower housing 1613 includes a first screw accommodation groove 1613a, a second screw accommodation groove 1613b, a third screw accommodation groove 1613c, and a fourth screw accommodation groove 1613d, which are aligned with the first screw hole 1611a, the second screw hole 1611b, the third screw hole 1611c, and the fourth screw hole 1611d, respectively.

Each of the plurality of hinge members 1620 and 1630 includes a sliding part 1621 or 1631 and a connection part 1623 or 1633 extending from the sliding part 1621 or 1631 and connected to the first part or the second part of the housing. More specifically, a first hinge member 1620 includes a first sliding part 1621 and a first connection part 1623 extending from the first sliding part 1621 and connected to the first part of the housing, and a second hinge member 1630 includes a second sliding part 1631 and a second connection part 1633 extending from the second sliding part 1631 and connected to the second part of the housing. Although FIGS. 16 to 19 illustrate the hinge module 1600 including the first hinge member 1620 and the second hinge member 1630, the number of hinge members included in the hinge module 1600 is not limited thereto. For example, the hinge module 1600 may include more than two hinge members.

When the first connection part 1623 of the first hinge member 1620 is connected to the first part, the second connection part 1633 of the second hinge member 1630 may be connected to the second part.

The sliding part 1621 or 1631 may be inserted into a space between the guide member 1641 or 1643 and the hinge housing 1613, and may perform a sliding motion between the guide member 1641 or 1643 and the hinge housing 1613. For example, the rear surface of the sliding part 1621 or 1631 is slidable on the front surface of the lower housing 1613, facing the rear surface thereof, and the guide member 1641 is slidable on the rear surface of the guide member 1641 or 1643, facing the front surface thereof. When the sliding part 1621 or 1631 performs a sliding motion, the hinge module 1600 may rotate the first part or the second part connected to the connection part 1622 or 1633. When the sliding part 1621 or 1631 slides between the guide member 1641 or 1643 and the hinge housing 1613, the guide member 1641 or 1643 and the lower housing 1613 may provide a frictional force that stops the sliding part 1621 or 1631 at a certain position by firmly holding the sliding part 1621 or 1631.

The sliding parts 1621 and 1631 may have a half-ring shape.

For the sliding parts 1621 and 1631 and the guide members 1641 and 1643, the surfaces facing each other may include curved surfaces having substantially the same curvature. More specifically, the front surface of the first sliding part 1621 and the rear surface of the first guide member 1641 may include curved surfaces having substantially the same curvature, and the front surface of the second sliding part 1631 and the rear surface of the second guide member 1643 may include curved surfaces having substantially the same curvature.

For the sliding parts 1621 and 1631 and the lower housing 1613, the surfaces facing each other may include curved surfaces having substantially the same curvature. More specifically, the rear surface of the first sliding part 1621 and the front surface of the lower housing 1613 may include curved surfaces having substantially the same curvature, and the rear surface of the second sliding part 1631 and the front surface of the lower housing 1613 may include curved surfaces having substantially the same curvature.

The sliding parts 1621 and 1631 include respective openings 1621*a* and 1631*a* formed in the central portion thereof to extend in the direction of the sliding motion of the sliding part 1621 or 1631. Alternatively, only one of the sliding parts 1621 and 1631 may include an opening. The sliding part 1621 or 1631 may include an opening 1621*a* or 1631*a* opened from a first position spaced apart from a side surface thereof facing the connection part 1623 or 1633 by a predetermined distance to a second position spaced apart from the other side surface thereof by a predetermined distance.

The connection parts 1623 and 1633 of the hinge members 1620 and 1630 include through holes 1623*a*, 1623*b*, 1633*a*, and 1633*b* formed to penetrate the connection part from the front surface to the rear surface thereof. Screw members may be inserted into the through holes 1623*a*, 1623*b*, 1633*a*, and 1633*b* formed in the connection parts 1623 and 1633, which may be connected to the first part or the second part by the screw members.

Each of the plurality of guide members 1641 and 1643 may include a fastening portion fastened to the lower housing 1613 and a guide portion extending from the fastening portion and spaced apart from the lower housing 1613 by a predetermined distance. The fastening portion may be substantially plate-shaped. The guide portion may have a width wider than the width of the fastening portion. For example, a portion of the side surface of the guide portion may be connected to the side surface of the fastening portion. The guide portion may include side portions having an area of a predetermined size in opposite directions with respect to a central portion connected to the fastening portion. The side portions may form a predetermined angle with the fastening portion. The side portions may be inclined upward in the fastening direction at opposite sides of the central portion. Accordingly, when the fastening portions of the guide members 1641 and 1643 are fastened to the lower housing 1613, the side portions of the guide portions spaced apart from the lower housing 1613 by a predetermined distance are inclined upwards in the fastening direction. Thus, the sliding motions of the sliding parts 1621 and 1631 sliding along the rear surfaces of the side portions may be guided in the upwardly inclined directions of the side portions.

Each of the guide portions of the guide members 1641 and 1643 may include a protrusion 1643*b* (or a detent) on the surface facing the sliding part 1621 or 1631. The protrusion 1643*b* may protrude by a predetermined size from the rear surface of the guide portion, which faces the front surface of the sliding part 1621 or 1631. The protrusion 1643*b* may apply pressure when the sliding part 1621 or 1631 slide along the guide portion.

When the sliding part 1621 or 1631 slides in a first direction along the guide portion and slides by a predetermined distance (e.g., when the foldable electronic device is unfolded by a predetermined angle), the protrusion 1643*b* may be inserted into the groove 1631*c* formed by being recessed on the front surface of the sliding part 1621 or 1631. When the protrusion 1643*b* is inserted into the groove 1631*c* formed in the sliding part 1621 or 1631 during the sliding operation of the sliding part 1621 or 1631, the sliding operation may be limited.

When the sliding part 1621 or 1631 slides in a second direction along the guide portion and slides by a predetermined distance (e.g., when the foldable electronic device is folded by a predetermined angle), the protrusion 1643*b* may be engaged with the inclined surface 1631*d* formed on the end portion of the sliding part 1621 or 1631. When the protrusion 1643*b* is engaged with the inclined surface 1631*d* formed in the end portion of the sliding part 1621 or 1631 during the sliding operation of the sliding part 1621 or 1631, the sliding operation may be limited.

Each of the plurality of guide members 1641 and 1643 may be fastened to the lower housing 1613 to be spaced apart from the lower housing 1613 by a predetermined distance, thereby forming a space therebetween. Accordingly, each of the sliding parts 1621 and 1631 may be inserted into and perform a sliding motion in a space between each of the guide members 1641 and 1643 (e.g., side portions of the guide portions) and the lower housing 1613.

Each of the plurality of guide members 1641 and 1643 may include a screw hole 1641*a* or 1643*a* penetrating the guide member from the front surface to the rear surface thereof. For example, the fastening portion of the first guide member 1641 includes a fifth screw hole 1641*a*, and the fastening portion of the second guide member 1643 includes a sixth screw hole 1643*a*.

The screw holes 1641*a* and 1643*a* in the guide members 1641 and 1643 may be located at positions aligned with the screw holes 1611*a*, 1611*b*, 1611*c*, and 1611*d* in the upper housing 1611 and the screw accommodation grooves 1613*a*, 1613*b*, 1613*c*, and 1613*d* in the lower housing 1613. More specifically, the fifth screw hole 1641*a* in the first guide member 1641 may be located at a position aligned with the second screw hole 1611*b* in the upper housing 1611 and the second screw accommodation groove 1613*b* in the lower housing 1613, and the sixth screw hole 1643*a* in the second guide member 1643 may be located at a position aligned with the third screw hole 1611*c* in the upper housing 1611 and the third screw accommodation groove 1613*c* in the lower housing 1613. Accordingly, when the second screw member 1673 inserted into the second screw hole 1611*b* in the upper housing 1611 is accommodated in the second screw accommodation groove 1613*b* in the lower housing 1613 through the fifth screw hole 1641*a* in the first guide member 1641, the first guide member 1641 may be fastened to the lower housing 1613. Further, when the third screw member 1675 inserted into the third screw hole 1611*c* in the upper housing 1611 is accommodated in the third screw accommodation groove 1613*c* in the lower housing 1613 through the sixth screw hole 1643a in the second guide member 1643, the second guide member 1643 may be fastened to the lower housing 1613.

The screw holes 1641a and 1643a formed in the guide members 1641 and 1643 may be located at positions eccentric from the centers of the fastening portions of the guide members 1641 and 1643 towards the connection parts 1623 and 1633 (e.g., opposite the portion in which the guide portions are connected to each other). For example, the second screw member 1673 and the third screw member 1675, which fix the guide members 1641 and 1643 to the lower housing 1613, may fix the guide members 1641 and 1643 at eccentric positions rather than at the centers of the fastening portions of the guide members 1641 and 1643, respectively. In this case, because each of the screw members presses the guide member 1641 or 1643 at the eccentric position rather than at the centers of the fastening portion, when each of the sliding parts 1621 and 1631 performs the sliding motion, the frictional force in a region adjacent to the connection part 1632 or 1633 may be greater than the frictional force in a region adjacent to the central portion of the lower housing 1613. Accordingly, when the user fully unfolds the foldable electronic device, the flexible display may be maintained at a desired angle due to the frictional force in the regions adjacent to the connection parts 1623 and 1633. In addition, because the screw members are inserted at the eccentric positions rather than at the centers of the fastening portions of the guide members 1641 and 1643, it may be advantageous to secure a space for accommodating the flexible display.

Because the second screw member 1673 and the third screw member 1675 press the guide members 1641 and 1643 at the eccentric positions rather than at the centers of the fastening portions, the spacing distance between the guide members 1641 and 1643 and the lower housing 1613 may become smaller towards the regions adjacent to the connection parts 1623 and 1633.

Each of the sliding parts 1621 and 1631 may have a first portion, from which the connection part 1623 or 1633 extends, and a second portion located opposite the first portion, in which the thickness of the second portion may be greater than that of the first portion. Accordingly, because the second screw member 1673 and the third screw member 1675 press the guide members 1641 and 1643 at the eccentric positions, the spacing distance between the guide members 1641 and 1643 and the lower housing 1613 may become smaller towards the regions adjacent to the connection parts 1623 and 1633. Due to the thickness of the second portion of each of the sliding parts 1621 1631 being greater than that of the first portion, it may be easier to unfold the foldable electronic device than to fold the foldable electronic device. For example, when the foldable electronic device is folded, the sliding parts 1621 and 1631 perform a sliding motion towards the connection parts 1623 and 1633. Because the second portions of the sliding parts 1621 and 1631 are moved in a direction in which the spaces between the guide members 1641 and 1643 and the lower housing 1613 become narrower, the user may have to apply a greater force. However, when the foldable electronic device is unfolded, the sliding parts 1621 and 1631 performs the sliding motion away from the connection parts 1623 and 1633, and at this time, the second portions of the sliding parts 1621 and 1631 move in the direction in which the spaces between the guide members 1641 and 1643 and the lower housing 1613 become wider, in order for the user to unfold the foldable electronic device with a smaller force. For example, when the foldable electronic device is folded, the second portions of the sliding parts 1621 and 1631 may be fixed due to the frictional force in the regions in which the distances between the guide members 1641 and 1643 and the hinge housing 1613 become smaller than or equal to a predetermined, such that the user may maintain the flexible display at a desired angle.

The lower housing 1613 may include a limiting portion protruding on the front surface thereof facing each of the sliding parts 1621 and 1631. The limiting portion may be inserted into each of the opening 1621a or 1631a in each of the sliding parts 1621 and 1631 in order to guide the sliding part 1621 or 1631, such that the sliding part 1621 or 1623 is not released when performing the sliding motion, and to limit the sliding motion of the sliding part 1621 or 1631. When the foldable electronic device is folded, the movement of each of the sliding parts 1621 and 1631 may be limited because one side wall formed by the opening 1621a or 1631a is engaged with a vertical surface of the limiting part. However, when the foldable electronic device is unfolded, the movement of each of the sliding parts 1621 and 1631 may be limited because the other side wall formed by the opening 1621a or 1631a is engaged with a side wall of the guide member 1641 or 1643.

The plurality of gears 1651, 1653, and 1655 are disposed between the plurality of hinge members 1620 and 1630. Although FIGS. 16 to 19 illustrate a first gear 1651, a second gear 1653, and a third gear 1655, the number of gears is not limited thereto.

The plurality of gears 1651, 1653, and 1655 may screw-couple the plurality of hinge members 1620 and 1630. More specifically, the gear teeth of the first gear 1651 may be engaged with the gear teeth 1621b on the side surface of the first sliding part 1621 of the first hinge member 1620, the gear teeth of the second gear 1653 may be engaged with the gear teeth 1631b on the side surface of the second sliding part 1621 of the second hinge member 1630, and the gear teeth of the first gear 1651 and the gear teeth of the second gear 1653 may be engaged with the gear teeth of the third gear 1655. Accordingly, the first hinge member 1620 and the second hinge member 1630 may be simultaneously rotated (or slid) by the first gear 1651, the second gear 1653, and the third gear 1655. In this case, the first hinge member 1620 and the second hinge member 1630 may slide in opposite directions. For example, when the gears 1651, 1653, and 1655 rotate, the first sliding part 1621, which is connected to the first gear and is engaged in the rotation of the first part, may slide clockwise (or counterclockwise), and the second sliding part 1631, which is connected to the second gear 1653 and is engaged in the rotation of the second part, may slide counterclockwise (or clockwise). Accordingly, the first part and the second part may rotate towards each other as the foldable electronic device may be folded, or the first part and the second part may rotate away from each other as the foldable electronic device may be unfolded.

Among the plurality of gears 1651, 1653, and 1655, the first gear 1651 and the second gear 1653 connected to the hinge members 1620 and 1630 include through a through hole 1651a or 1653a formed through the central portion thereof. More specifically, the first gear 1651 connected to the first hinge member 1620 includes a first through hole 1651a formed through the central portion thereof, and the second gear 1653 connected to the second hinge member 1630 includes a second through hole 1653a formed through the central portion thereof.

A gear shaft 1661 or 1663 may be inserted into a through the first through hole 1651a or the second through hole 1653a formed in each of the first gear 1651 and the second gear 1653. More specifically, a first gear shaft 1661 may be inserted into the first through hole 1651*a* in the first gear 1651, and a second gear shaft 1663 may be inserted into a second through hole 1653*a* in the second gear 1653.

The first gear shaft 1661 and the second gear shaft 1663 may control the rotational force of the first gear 1651 and second gear 1653. More specifically, the gear shafts 1661 and 1663 may control the rotational force (torque) of the gears 1651 and 1653 by applying a pressure outward from the inner central portions of the gears 1651 and 1653, respectively. When the thicknesses of the gear shafts 1661 and 1663 are larger than the inner diameters of the gears 1651 and 1653 (e.g., the diameters of the through holes 1651*a* and 1653*a* into which the gear shafts 1661 and 1663 are inserted), the rotational force required for rotating the gears 1651 and 1653 may increase. That is, by controlling the rotational force of the gears 1651 and 1653 through the adjustment of the thicknesses of the gear shafts 1661 and 1653, it is possible to control the sliding motions of the hinge members 1620 and 1630 connected to the gears 1651 and 1653. Consequently, it is possible to control the opening/closing angle of the foldable electronic device (e.g., to implement a free stop function). In addition, because the elasticity and frictional force of the gear shafts 1661 and 1663 may vary depending on materials of the gear shafts 1661 and 1663 (e.g., stainless steel), the rotational force of the gears 1651 and 1653 may be controlled depending on the materials of the gear shafts 1661 and 1663.

Each of the gear shafts 1661 and 1663 may have a cylindrical shape having a hollow central portion extending from a front end to a rear end thereof and opened at one side portion. When each of the gear shafts 1661 and 1663 is inserted into the through hole 1651*a* or 1653*a* formed in the gear 1651 or 1653, the gear shaft 1661 or 1663 may contract, and when the insertion is completed, the gear shaft 1661 or 1663 may expand in order to apply a pressure outwards from the inner central portion of the gear 1651 or 1653.

Each of the gear shaft 1661 and 1663 may have a shape protruding to a predetermined size from at least one of the front surface or the rear surface of the gear 1651 or 1653. The protrusion of each of the gear shafts 1661 and 1663 may be connected to the hinge housing 1611 or 1613, and due to the connection structure between the protrusions and the hinge housings 1611 and 1613, the gear shafts 1661 and 1663 may not rotate when the gears 1651 and 1653, into which the gear shafts 1661 and 1663 are inserted, are rotated. Accordingly, because the gear shafts 1661 and 1663 are not rotated when the gears 1651 and 1653 are rotated, a frictional force may be generated in the portions in which the gears 1661 and 1653 and the gear shafts 1661 and 1663 come into contact with each other.

Figure 20:
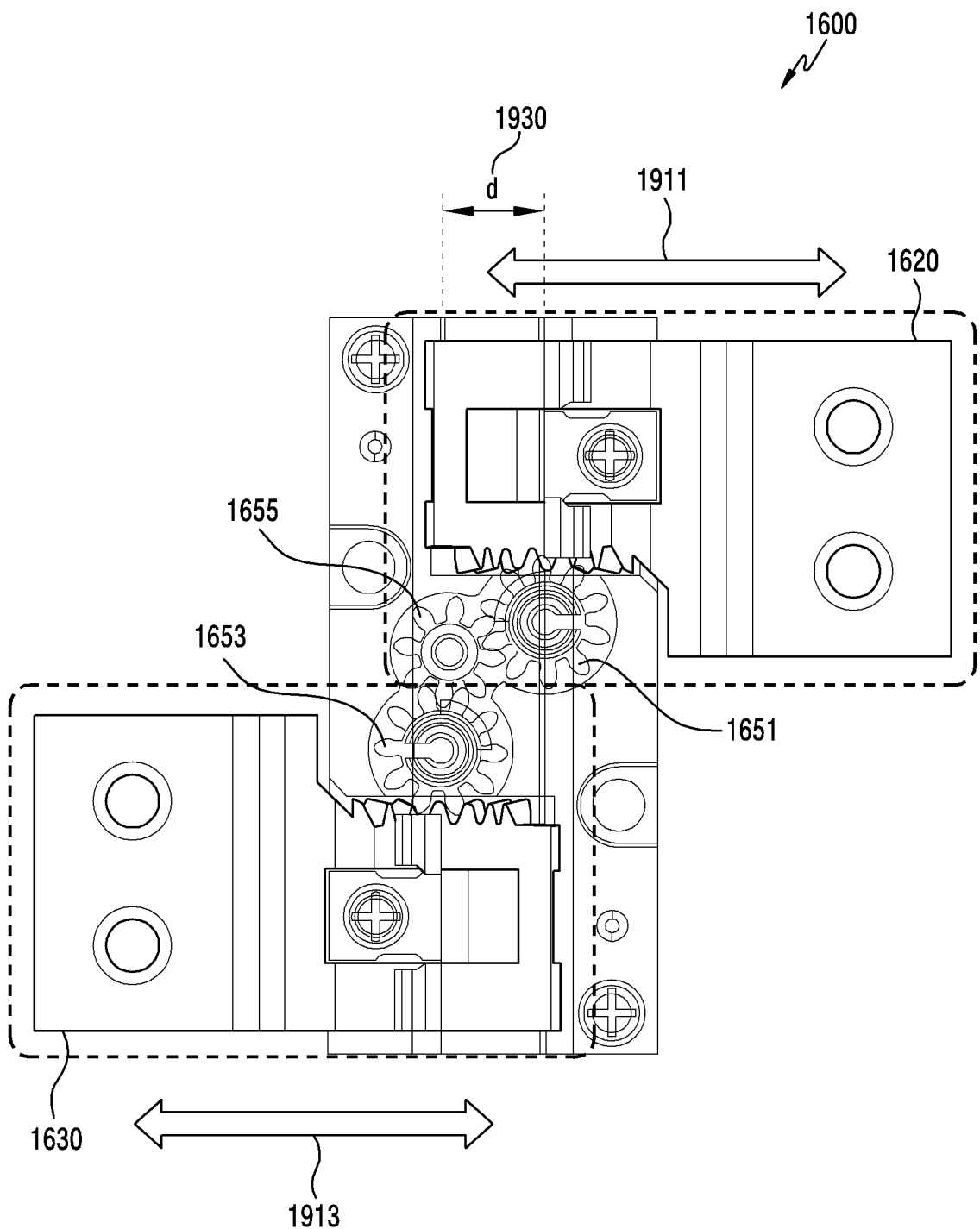
FIG. 20 illustrates arrangement positions of sliding parts included in hinge modules according to an embodiment.

FIG. 20 illustrates arrangement positions of sliding parts included in hinge modules according to an embodiment.

Referring to FIG. 20, the arrangement positions of the sliding parts 1621 and 1631 of the hinge modules 1620 and 1630 may be determined based on the arrangement positions of the plurality of gears 1651, 1653, and 1655 connected to the sliding parts 1621 and 1631. The arrangement positions of the first gear 1651 connected to the first sliding part 1621 and the second gear 1653 connected to the second sliding part 1631 may be determined based on the arrangement position of the third gear 1655 interconnecting the first gear 1651 and the second gear 1653. When the arrangement positions of the first gear 1651 and the second gear 1653 are determined, the arrangement positions of the first sliding part 1621 connected to the first gear 1651 and the second sliding part 1631 connected to the second gear 1653 may also be determined. That is, by changing the arrangement positions of the gears 1651, 1653, and 1655, the arrangement positions of the first hinge module 1620 and the second hinge module 1630 may be shifted as shown by arrows 1911 and 1913.

When the third gear 1655 is shifted to the left side (or the right side) while the diameters of the gears 1651, 1653, and 1655 are fixed, the first gear 1551 and/or the second gear 1653 engaged with the third gear 1655 may be shifted to the left side (or the right side) depending on the shifting direction of the arrangement position of the third gear 1655. When the third gear 1655 is shifted to the left side, the first gear 1651 and the second gear 1653 may be shifted in the direction in which the first gear 1651 and the second gear 1653 become closer to each other, and when the third gear 1655 is shifted to the right side, the first gear 1651 and the second gear 1653 may be shifted in the direction in which the first gear 1651 and the second gear 1653 move away each other.

When the first gear 1651 and the second gear 1653 are shifted in a direction in which the first gear 1651 and the second gear 1653 move closer to each other or in the direction in which the first gear 1651 and the second gear 1653 move away from each other, the first hinge module 1620 and the second hinge module 1630, which are respectively connected to the first gear 1651 and the second gear 1653, may also be shifted in the direction in which the first hinge module 1620 and the second hinge module 1630 move closer to each other or in the direction in which the first hinge module 1620 and the second hinge module 1630 move away from each other. When the first hinge module 1620 and the second hinge module 1630 are shifted in the direction in which the first hinge module 1620 and the second hinge module 1630 move closer to each other, the distance (d) 1930 between the first hinge module 1620 and the second hinge module 1630 may decrease, and when the first hinge module 1620 and the second hinge module 1630 are shifted in the direction in which the first hinge module 1620 and the second hinge module 1630 move away from each other, the distance (d) 1930 between the first hinge module 1620 and the second hinge module 1630 may increase. The distance (d) 1930 between the first hinge module 1620 and the second hinge module 1630 may be a space in which the flexible display is accommodated.

Figure 21:
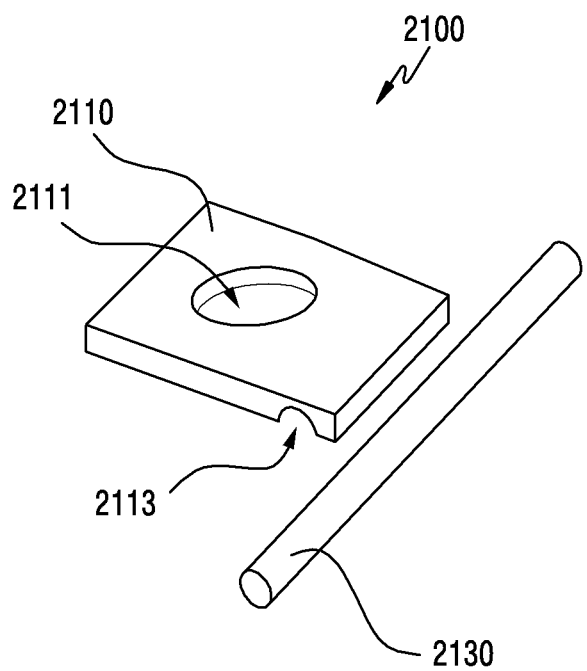
FIG. 21 illustrates a guide member according to an embodiment.
Figure 22:
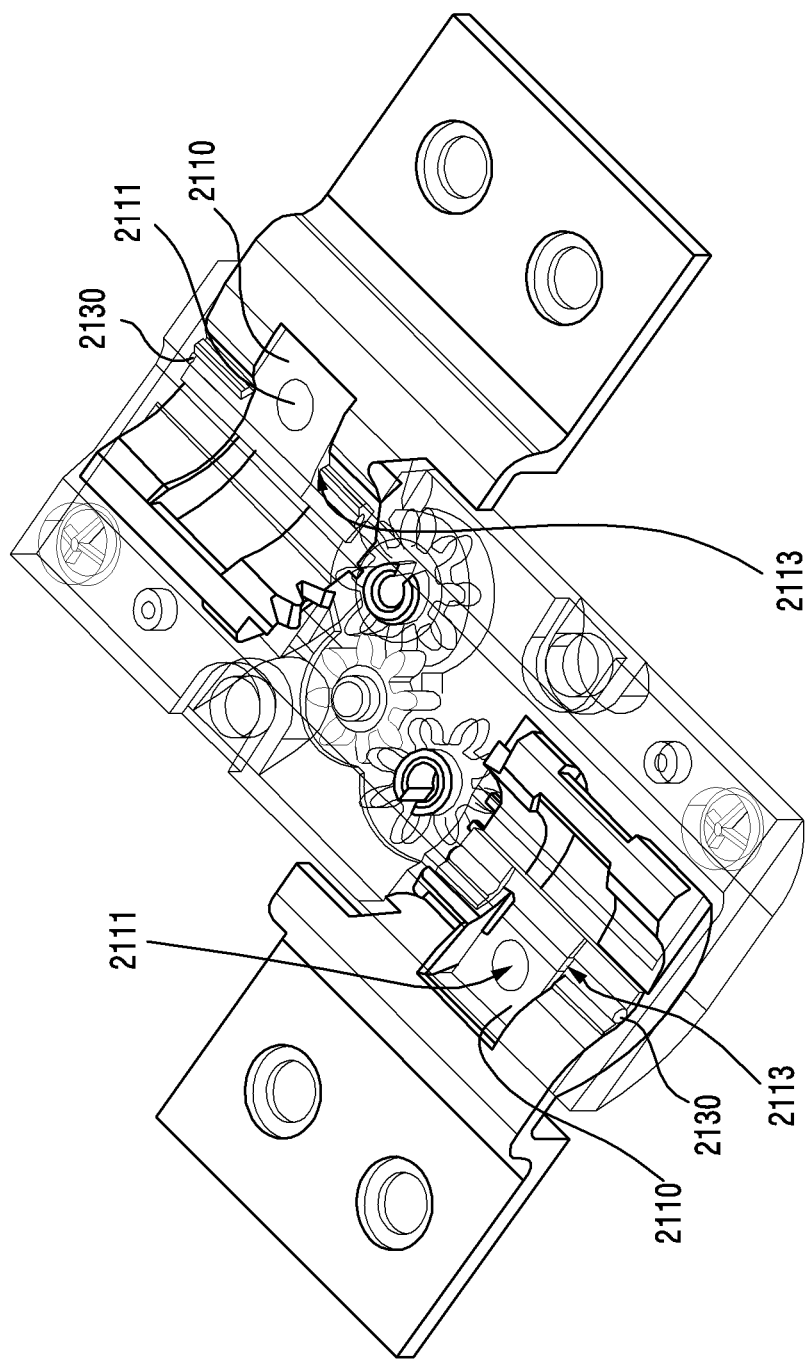
FIG. 22 illustrates a hinge module including the guide member of FIG. 21 in an assembled state according to an embodiment.

FIG. 21 illustrates a guide member according to an embodiment. FIG. 22 illustrates a hinge module including the guide member of FIG. 21 in the assembled state according to an embodiment.

Referring to FIGS. 21 and 22, a guide member 2100 includes a fastening portion 2110 fastened to the lower housing of the a hinge module and a guide portion 2130 that guides the sliding motion of a sliding part of the hinge module. Although FIGS. 16 to 19, as described above, illustrate guide members 1641 and 1643 that are integrally formed, FIGS. 21 and 22 illustrate the fastening portion 2110 of the guide member 2100 and the guide portion 2130 being provided in a separated state.

The fastening portion 2110 may be substantially plate-shaped. The fastening portion 2110 includes a screw hole 2111. The screw hole 2111 in the fastening part 2110 may be arranged at a position aligned with one of the screw holes in the upper housing of the hinge module, and one of the screw accommodation grooves in the lower housing. Accordingly, the guide member 2100 may be fastened to the lower housing when the screw member inserted into the screw hole in the upper housing is accommodated in the screw accommodation groove passing through the screw hole 2111 in the guide member 2100.

The fastening portion 2110 includes a groove 2113 recessed in the rear surface thereof. The groove 2113 may extend in the width direction of the fastening portion 2110. The guide portion 2130 may be inserted into the groove 2113. The guide portion 2130 may have a cylindrical shape, and the groove 2113 may have a semi-cylindrical shape.

When the fastening portion 2110 is coupled to the lower housing, the guide portion 2130 may be inserted into the groove 2113 in the fastening part 2110 and may be positioned on the front surface of the sliding part. In this case, the fastening portion 2110 may press the guide portion 2130 inserted into the groove 2113 towards the sliding part. That is, the fastening portion 2110 may apply a pressure to the guide portion 2130, and the frictional force between the guide portion 2130 and the sliding part may increase by the pressure. Because the frictional force controls the sliding motion of the sliding part, the opening/closing angle of the foldable electronic device may be controlled.

An electronic device according to the above-described embodiments may include, for example, a portable communication device (e.g., a smartphone), a computer device, a portable multimedia device, a portable medical device, a camera, a wearable device, or a home appliance. However, the electronic devices are not limited to these examples.

Various embodiments of the disclosure and the terms used therein are not intended to limit the technological features set forth herein to particular embodiments and include various changes, equivalents, or replacements for a corresponding embodiment. Regarding the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wiredly), wirelessly, or via a third element.

Herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, a module may be implemented in a form of an application-specific integrated circuit (ASIC).

Various embodiments as set forth herein may be implemented as software including one or more instructions that are stored in a storage medium that is readable by a machine. For example, a processor of the machine may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities.

One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to certain embodiments thereof, it will be understood by those skilled in the art that various changes in form and details may be made therein without departing from the spirit and scope of the disclosure as defined by the appended claims and any equivalents thereof.

What is claimed is:

1. A foldable electronic device, comprising: a housing including a first part and a second part; a flexible display seated on the first part and the second part; and a hinge structure configured to fold and unfold the first part and the second part of the housing with respect to each other, wherein the hinge structure includes: a hinge member including a sliding part and a connection part extending from the sliding part and connected to the first part or the second part; a guide member; and a hinge housing surrounding at least a part of the hinge member and the guide member, wherein the guide member is fastened to the hinge housing to form a space with the hinge housing, wherein the sliding part is received in the space, sliding along the space between the guide member and the hinge housing, wherein the sliding part includes an opening in a middle portion of the sliding part that extends from a side surface spaced apart from the connection part to an opposite side surface in a direction of the sliding motion, wherein the hinge housing includes a limiting portion protrusion that is received in the opening, wherein the side surface contacts the limiting portion protrusion based on a first sliding motion of the sliding part in a first direction, and wherein the opposite side surface contacts the guide member based on a second sliding motion of the sliding part in a second direction different from the first direction.

2. The foldable electronic device of claim 1, wherein the sliding part includes a first surface and second surface, the hinge housing includes a third surface, and the guide member includes a fourth surface,
- wherein the first surface and the fourth surface face each other, and the second surface and the third surface face each other,
- wherein the first surface and the fourth surface have a substantially same first curvature, and
- wherein the second surface and the third surface face have a substantially same second curvature.

3. The foldable electronic device of claim 1, wherein the first part and the second part of the housing are folded against each other, a side surface formed by the opening is engaged with the limiting portion and limits movement of the sliding part.

4. The foldable electronic device of claim 1, wherein the guide member includes a screw hole eccentrically disposed toward the connection part from a central portion of the guide member, and receives a screw member to fasten the guide member and the hinge housing to each other.

5. The foldable electronic device of claim 1, wherein, when the first part and the second part of the housing are unfolded from each other, a first end of the sliding part is drawn out of the space and supports the flexible display.

6. The foldable electronic device of claim 1, further comprising:
- a first support plate attached to the flexible display; and
- a second support plate attached to the flexible display,
- wherein the first support plate includes a first support portion protruding towards the first part and fastened to the first part, and
- wherein the second support plate includes a second support portion protruding towards the second part and fastened to the second part.

7. The foldable electronic device of claim 1, wherein the sliding part includes a first protrusion,
- wherein the hinge housing includes a second protrusion, and
- wherein, when the first part or the second part is unfolded, the first protrusion engages with the second protrusion and supports that the first part and the second part at a first angle therebetween.

8. The foldable electronic device of claim 1, wherein the sliding part includes a protrusion formed,
- wherein the guide member includes a groove, and
- wherein, when the first part or the second part is unfolded, the protrusion is received by the groove and supports the first part and the second part at a first angle therebetween.

9. The foldable electronic device of claim 1, wherein the hinge structure includes a first hinge structure configured to rotate the first part about a first axis and a second hinge structure configured to rotate the second part about a second axis,
- wherein the first hinge structure includes a first connection part connected to the first part,
- wherein the second hinge structure includes a second connection part connected to the second part, and
- wherein the first axis and the second axis are spaced apart from each other by a predetermined distance.

10. The foldable electronic device of claim 9, further comprising a gear disposed between the first hinge structure and the second hinge structure,
- wherein a first sliding part included in the first hinge structure includes a first gear portion that engages with the gear,
- wherein a second sliding part included in the second hinge structure includes a second gear portion that engages with the gear, and
- wherein, when the first sliding part slides in a first direction, the second sliding part slides in a second direction different from the first direction.

11. The foldable electronic device of claim 1, further comprising a gear disposed adjacent to the hinge structure,
- wherein the sliding part includes a gear portion that engages with the gear.

12. The foldable electronic device of claim 11, further comprising a rotation limiting portion including an engagement portion, and
- wherein, when the first part or the second part is unfolded, the gear engages with the engagement portion and support the first part and the second part at a first angle therebetween.

* * * * *